United States Patent
Shigematsu et al.

(10) Patent No.: US 6,912,094 B2
(45) Date of Patent: Jun. 28, 2005

(54) PROJECTION OPTICAL SYSTEM, A PROJECTION EXPOSURE APPARATUS, AND A PROJECTION EXPOSURE METHOD

(75) Inventors: Koji Shigematsu, Kawasaki (JP); Masayuki Mizusawa, Kumagaya (JP); Youhei Fujishima, Ageo (JP); Miho Matsumoto, Tokyo-to (JP)

(73) Assignee: Nikon Corporation, Tokyo (JP)

( * ) Notice: Subject to any disclaimer, the term of this patent is extended or adjusted under 35 U.S.C. 154(b) by 267 days.

(21) Appl. No.: 10/028,711

(22) Filed: Dec. 28, 2001

(65) Prior Publication Data
US 2003/0007138 A1 Jan. 9, 2003

(30) Foreign Application Priority Data
Mar. 27, 2001 (JP) .................................. P2001-090646

(51) Int. Cl.[7] ................................................ G02B 9/00
(52) U.S. Cl. ...................................... 359/649; 359/754
(58) Field of Search ................................ 359/649–651, 359/754

(56) References Cited

U.S. PATENT DOCUMENTS

| | | |
|---|---|---|
| 5,105,075 A | 4/1992 | Ohta et al. |
| 5,253,110 A | 10/1993 | Ichihara et al. |
| 5,473,410 A | 12/1995 | Nishi |
| 5,477,304 A | 12/1995 | Nishi |
| 5,850,300 A | 12/1998 | Kathman et al. |
| 5,852,518 A | 12/1998 | Hatasawa et al. |
| 5,973,836 A | 10/1999 | Okada et al. |
| 6,014,455 A | 1/2000 | Sumiyoshi et al. |
| 6,191,898 B1 | 2/2001 | Trunz et al. |
| 6,235,438 B1 | 5/2001 | Suzuki et al. |
| 6,259,571 B1 | 7/2001 | Holderer et al. |
| 6,262,793 B1 | 7/2001 | Sasaya et al. |
| 6,271,976 B1 | 8/2001 | Weber |
| 6,295,119 B1 | 9/2001 | Suzuki |
| 6,341,007 B1 | 1/2002 | Nishi et al. |
| 6,556,353 B2 * | 4/2003 | Omura ....................... 359/649 |

FOREIGN PATENT DOCUMENTS

| | | |
|---|---|---|
| JP | A-1-198759 | 8/1989 |
| JP | A-4-192317 | 7/1992 |

(Continued)

Primary Examiner—Scott J. Sugarman
(74) Attorney, Agent, or Firm—Oliff & Berridge PLC

(57) ABSTRACT

A projection optical system that projects an image on a first side onto a second plane through a plurality of lenses includes the following elements in order from the first side to the second plane: a first lens group that has a negative refractive power, a second lens group that has a positive refractive power, a third lens group that has a negative refractive power, a fourth lens group that has an aperture stop in the optical path, and a fifth lens group that has a positive refractive power. A clear aperture of a lens surface or an outer diameter of a lens in the projection optical system has a relative maximum in the second lens group, a relative minimum in the third lens group, and a relative maximum in the third–fifth lens groups, and has only one significant minimum between the first side and the second plane.

77 Claims, 19 Drawing Sheets

FOREIGN PATENT DOCUMENTS

| | | |
|---|---|---|
| JP | A-4-196513 | 7/1992 |
| JP | A-5-175098 | 7/1993 |
| JP | A-7-183190 | 7/1995 |
| JP | A-7-245251 | 9/1995 |
| JP | A-8-327895 | 12/1996 |
| JP | A-8-330220 | 12/1996 |
| JP | A-9-106499 | 4/1997 |
| JP | A-9-329742 | 12/1997 |
| JP | A-10-54932 | 2/1998 |
| JP | A-10-125588 | 5/1998 |
| JP | A-10-133105 | 5/1998 |
| JP | A-10-142501 | 5/1998 |
| JP | A-10-163097 | 6/1998 |
| JP | A-10-163098 | 6/1998 |
| JP | A-10-163099 | 6/1998 |
| JP | A-10-206714 | 8/1998 |
| JP | A-10-214783 | 8/1998 |
| JP | A-10-284408 | 10/1998 |
| JP | A-11-44834 | 2/1999 |
| JP | A-11-174365 | 7/1999 |
| JP | A-11-195602 | 7/1999 |
| JP | A-11-352012 | 12/1999 |
| JP | A-2000-75493 | 3/2000 |
| JP | A-2000-164489 | 6/2000 |
| JP | A-2000-206385 | 7/2000 |
| JP | A-2000-235134 | 8/2000 |
| JP | A-2000-249886 | 9/2000 |

* cited by examiner

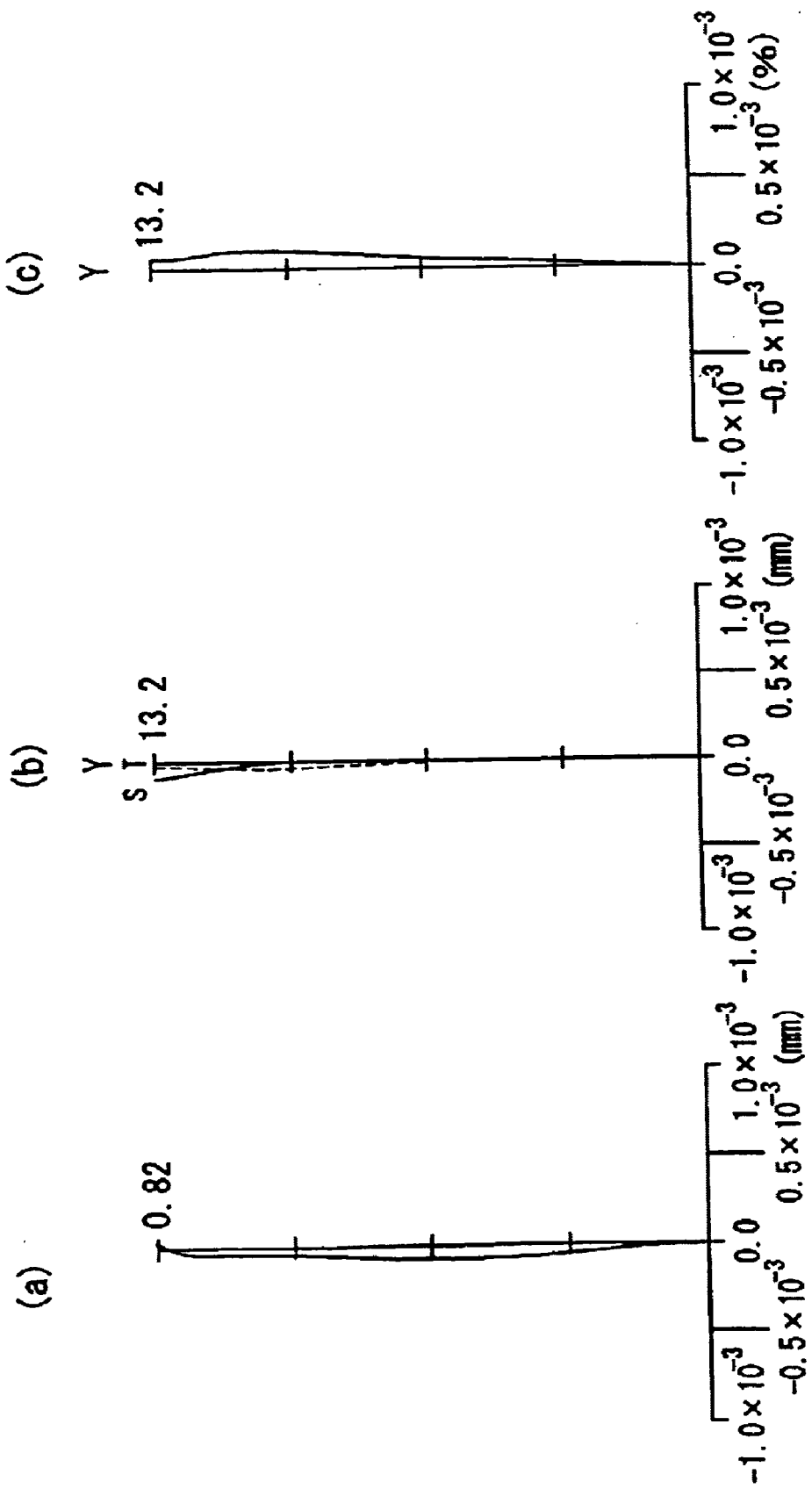

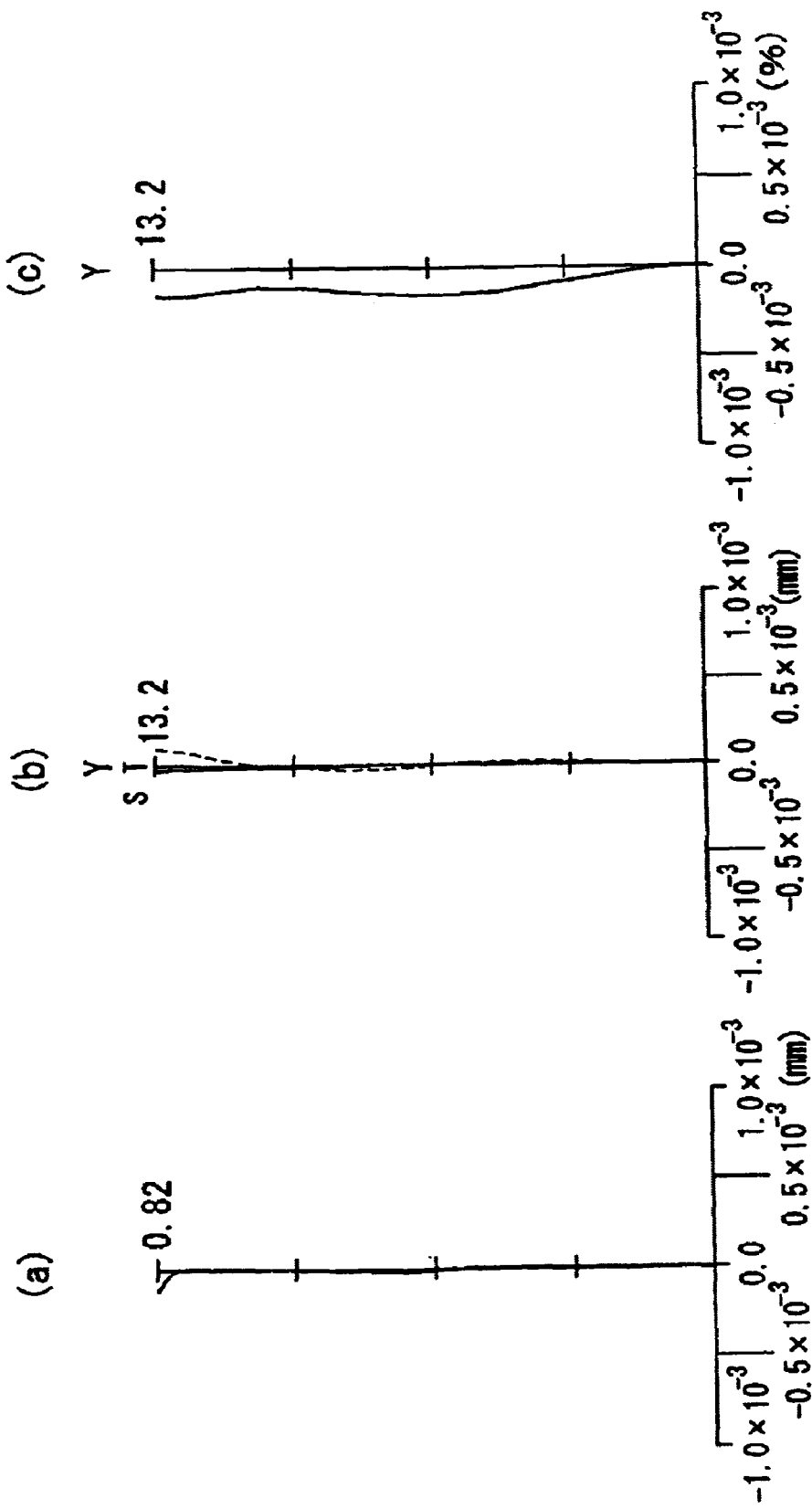

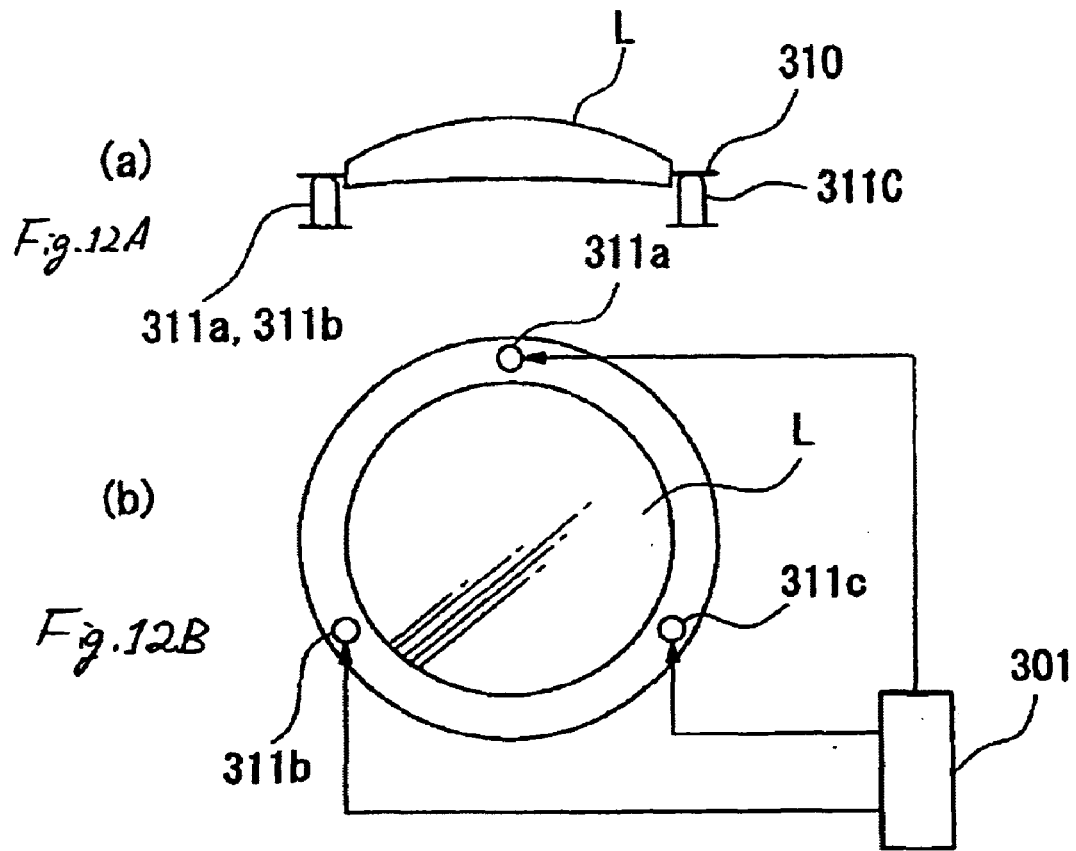
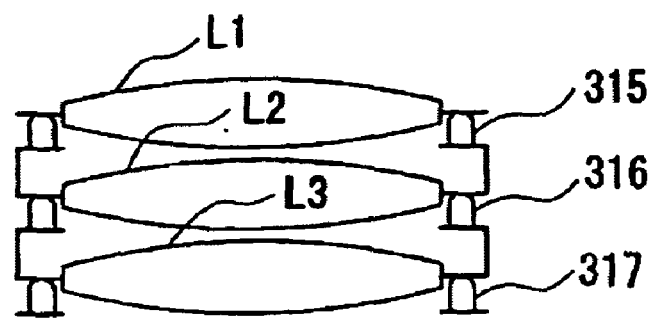

PROJECTION OPTICAL SYSTEM, A PROJECTION EXPOSURE APPARATUS, AND A PROJECTION EXPOSURE METHOD

BACKGROUND OF THE INVENTION

1. Field of the Invention

This invention relates to projection exposure apparatus and method and a projection optical system optimum for the projection exposure apparatus, which are used for producing micro devices, such as semiconductor integrated circuits, image pickup elements such as a CCD, liquid crystal displays, and thin film magnetic heads, with lithography techniques.

2. Background of the Related Art

In recent years, as circuit patterns of micro devices, such as semiconductor integrated circuits, have become more minute, a wavelength of an illumination light for exposure (exposure light) used in an exposure device, such as a stepper, has continuously become shorter. In other words, for the exposure light, a KrF excimer laser beam (wavelength: 248 nm) has become mainstream, instead of an i-line (wavelength: 365 nm) of a mercury lamp, which had been used conventionally. In addition, the use of an ArF excimer laser beam that has an even shorter wavelength has been achieved. Moreover, for the purpose of making the exposure light shorter, the use of, for example, a halogen molecular laser such as an F2 laser (wavelength: 157 nm) has been considered.

As an ultraviolet or vacuum ultraviolet light source, there are the above-described excimer laser, halogen molecular laser, and the like. However, materials that transmit radiated ultraviolet or vacuum ultraviolet beams are limited. Thus, only limited materials can be used for lens elements that structure the projection optical system, and the transmissivity of such limited material is not high. Currently, the performance of an anti-reflective coating provided on the surface of lens elements is not very high compared with that for longer wavelengths. Furthermore, recently, with the changes in illumination conditions in illumination optical systems and changes in environment of the projection optical system, it has been required to control the changes in image forming performance in the projection optical system.

SUMMARY OF THE INVENTION

Therefore, it is an object of this invention to provide a projection optical system that not only has an excellent image forming performance at the initial conditions, but also can maintain the excellent image forming performance even when the illumination conditions and/or the environment is/are changed.

To achieve the above objects, a first projection optical system of this invention is a projection optical system that projects an image on a first plane onto a second plane through a plurality of lenses and includes, from the first plane, a first lens group having a negative refractive power, a second lens group having a positive refractive power, a third lens group having a negative refractive power, a fourth lens group, and a fifth lens group having a positive refractive power. An clear aperture of a lens surface or an outer diameter of a lens in the projection optical system, from a direction from the first plane to the second plane, monotonically increases in the first lens group, has a tendency to change from increasing to decreasing in the second lens group, has a tendency to change from decreasing to increasing in the third lens group, and monotonically decreases in the fifth lens group. Where an clear aperture of a surface having the largest clear aperture or an outer diameter of a lens having the largest outer diameter in the second lens group is Mx2 and where an clear aperture of a surface having the smallest clear aperture or an outer diameter of a lens having the smallest outer diameter in the third lens group is Mn3, $$1.7 < Mx2/Mn3 < 4$$

is satisfied. At least one of the plurality of lenses is held such that at least one of its position and orientation(trim) is adjustable, and a numerical aperture of the second plane of the projection optical system is equal to or more than 0.8.

In addition, to achieve the above objects, a second projection optical system of this invention is a projection optical system that projects an image on a first plane onto a second plane through a plurality of lenses and includes, from the first plane, a first lens group having a negative refractive power, a second lens group having a positive refractive power, a third lens group having a negative refractive power, a fourth lens group, and a fifth lens group having a positive refractive power. An clear aperture of a lens surface or an outer diameter of the second and fourth lenses from the first plane among the plurality of lenses in the projection optical system monotonically increases. An clear aperture of a lens surface or an outer diameter of a lens in the projection optical system has a tendency to change from increasing to decreasing in the second lens group, has a tendency to change from decreasing to increasing in the third lens group, and monotonically decreases in the fifth lens group. Where an clear aperture of a surface having the largest clear aperture or an outer diameter of a lens having the largest outer diameter in the fourth lens group is Mn4 and where an clear aperture of a surface having the smallest clear aperture or an outer diameter of a lens having the smallest outer diameter in the fourth lens group is Mx4, $$0.77 < Mn4/Mx4 < 1$$

is satisfied. At least one of the plurality of lenses is held such that at least one of its position and orientation(trim) is adjustable, and a numerical aperture of the second plane of the projection optical system is equal to or more than 0.8.

Furthermore, to achieve the above objects, a third projection optical system of this invention is a projection optical system that projects an image on a first plane onto a second plane through a plurality of lenses and includes, from the first plane, a first lens group having a negative refractive power, a second lens group having a positive refractive power, a third lens group having a negative refractive power, a fourth lens group having an aperture stop in the optical path, and a fifth lens group having a positive refractive power. An clear aperture of a lens surface or an outer diameter of a lens in the plurality of lenses in the projection optical system has a relative maximum in the second lens group, a relative minimum in the third lens group, and a relative maximum in the third through fifth lens groups. The clear aperture or outer diameter has one significant minimum (prominence minimum) between the first plane and the second plane. At least one of the plurality of lenses is held such that at least one of a position and orientation is adjustable, and a numerical aperture of the second plane of the projection optical system is equal to or more than 0.8.

In this invention, when comparing sizes of a plurality of lenses in a direction of diameter, the "clear aperture" of a lens and the "outer diameter" of a lens have substantially the same meanings. An outer diameter of a lens is normally a value in which a width for holding the lens is added to an clear aperture of the lens. The width for holding the lens does not change greatly between the plurality of lenses structuring the projection optical system since it is limited to a size with which the lens is stably held, but which is not unnecessarily large. Therefore, for comparing the size of lenses in the plurality of lenses in a direction of the diameter, it is possible to use the terms "clear aperture" and "outer diameter" with the same meaning. However, when comparing the size of a lens in the direction of diameter using the term "outer diameter", lenses whose outer diameter is enlarged or made smaller with respect to the effective diameter of the lens for no reason are not to be included in the conditions established in this invention.

BRIEF DESCRIPTION OF DRAWINGS

FIG. 4 shows various aberration diagrams of the projection optical system of the first embodiment of this invention.

FIG. 6 shows various aberration diagrams of the projection optical system of the third embodiment of this invention.

FIG. 12 are diagrams showing an example of a mechanism that drives lenses using a driving element.

FIG. 13 is a diagram showing another example of the mechanism that drives lenses.

DETAILED DESCRIPTION OF PREFERRED EMBODIMENTS

Figure 1:
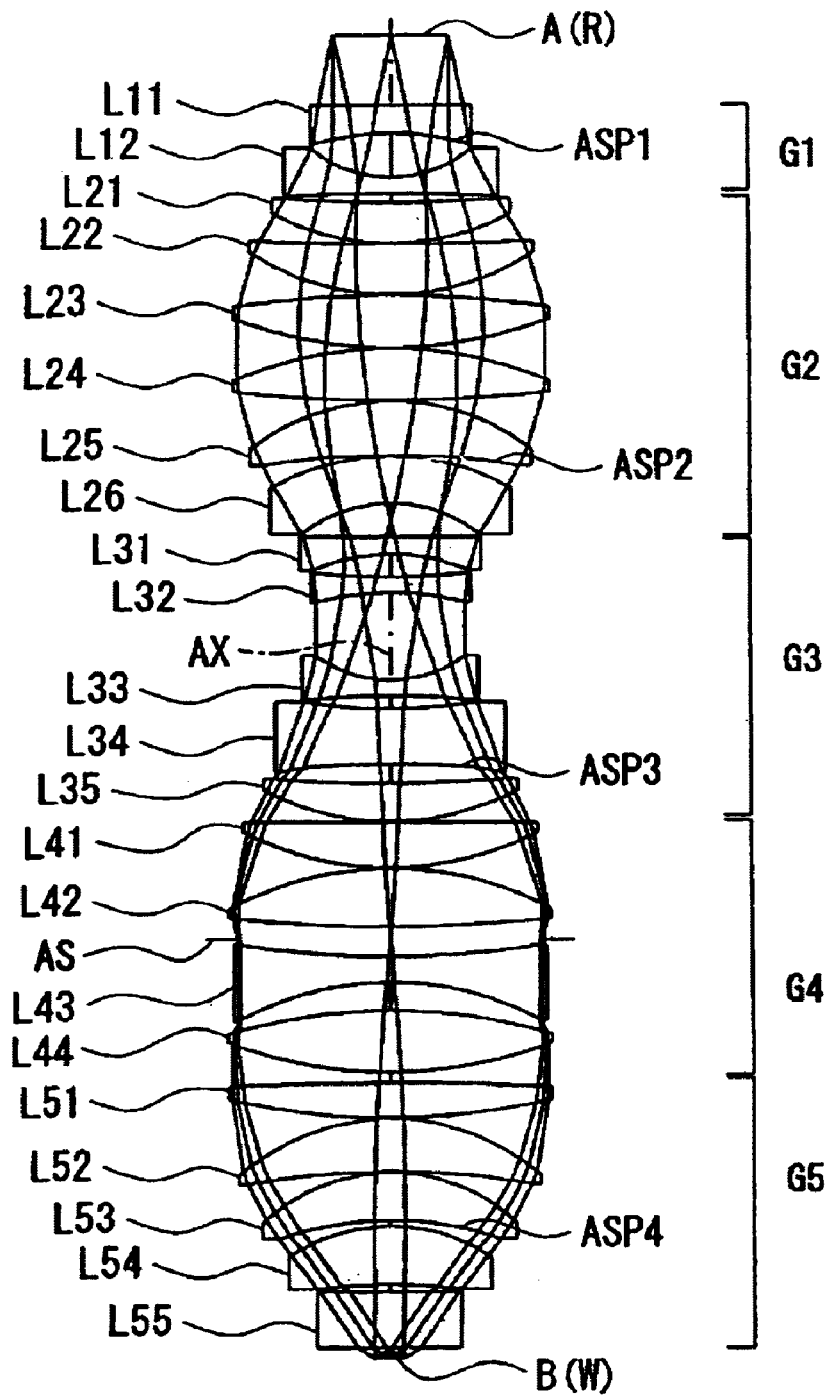
FIG. 1 is an optical path diagram of a projection optical system of a first embodiment of this invention.
Figure 2:
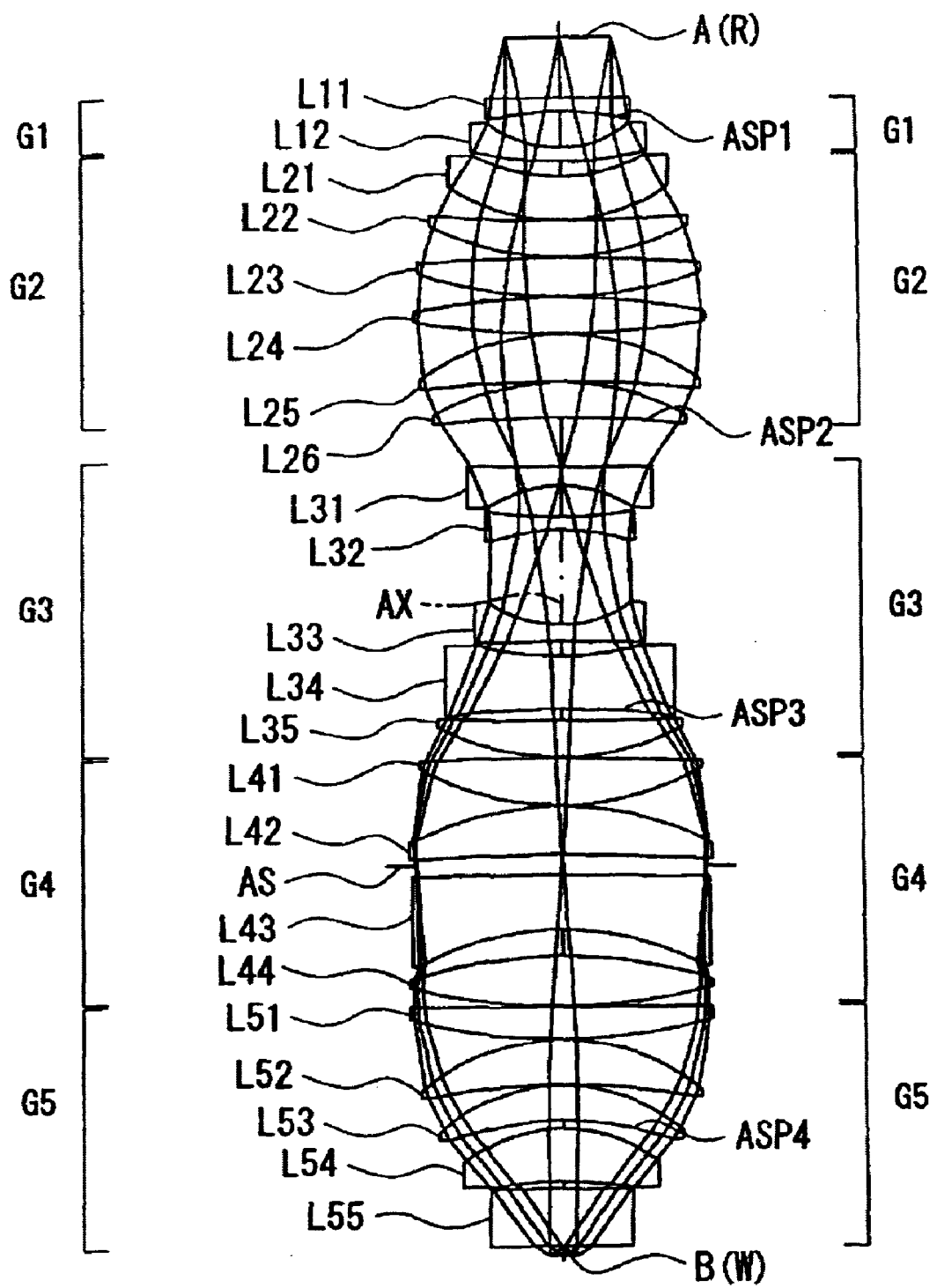
FIG. 2 is an optical path diagram of a projection optical system of a second embodiment of this invention.
Figure 3:
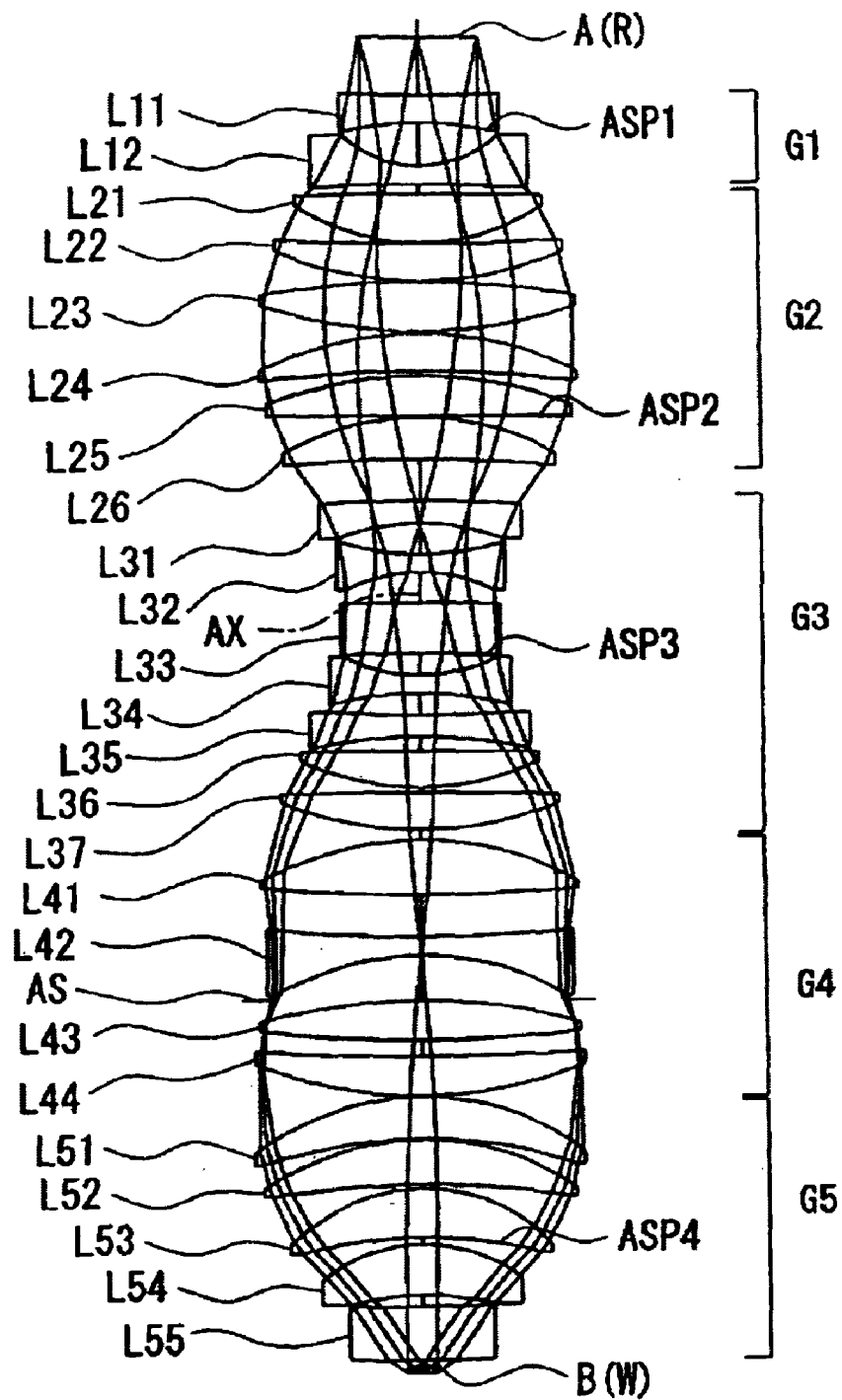
FIG. 3 is an optical path diagram of a projection optical system of a third embodiment of this invention.

An embodiment of this invention is described below with reference to drawings. FIGS. 1–3 are light path diagrams of projection optical systems according to the first-third embodiments. In FIGS. 1–3, the projection optical systems of the embodiments are of a dioprtic type that forms a reduced image of a pattern located on a first plane A onto a second plane B. If these projection optical systems are used in, for example, a projection exposure apparatus for manufacturing semiconductor devices, a pattern surface of a reticle R is positioned as an original for projection (mask) on the first plane A, and an application surface (exposure surface) for a photoresist of a wafer W that is an exposed substrate is positioned as a workpiece on the second plane B.

The projection optical system has, from the first plane A, a first lens group GI having a negative refractive power, a second lens group G2 having a positive refractive power, a third lens group G3 having a negative refractive power, a fourth lens group, and a fifth lens group G5 having a positive refractive power. An aperture stop is positioned between the third lens group G3 and the second plane B. In the example shown in FIGS. 1–3, an aperture stop is positioned in a light path of the fourth lens group G4. The numerical aperture on a side of the second plane B of the projection optical system is equal to or more than 0.8.

An clear aperture of a lens surface in the projection optical system, in a direction from the first plane A towards the second plane B, monotonically increases in the first lens group G1, tends to change from increasing to decreasing in the second lens group G2, tends to change from decreasing to increasing in the third lens group G3, and monotonically decreases in the fifth lens group G5. Alternatively, it can be structured, such that the clear aperture of the lens surface of the second through fourth lenses from the first plane A in a plurality of lenses in the projection optical system monotonically increases, while the clear aperture of the lens surface in the projection optical system, in a direction from the first plane A towards the second plane B, tends to change from increasing to decreasing in the second lens group G2, tends to change from decreasing to increasing in the third lens group G3, and monotonically decreases in the fifth lens group G5. The second lens group G2 and the third lens group G3 can effectively contribute to the Petzval sum.

In addition, the clear aperture of the lens surface of the plurality of lenses in the projection optical system has a relative maximum in the second lens group G2, a relative minimum in the third lens group G3, and a relative maximum in the third lens group G3 through the fifth lens group G5, while it has only one significant minimum between the first plane A and the second plane B. That is, the projection optical system of this embodiment is a single waist type image forming optical system. Moreover, by providing the lens structure having only one significant minimum between the first plane A and the second plane B, the number of lenses can be reduced, resulting in a short glass path length, and thus reducing the number of lens surfaces.

In the examples shown in FIGS. 1–3, among air (gas) lenses that the plurality of lenses in the projection optical system form, a gas lens positioned closest to the first plane A has a biconvex shape. The first lens group G1 has at least one negative lens. The second lens group G2 has at least one negative lens and at least three positive lenses. The third lens group G3 has at least two negative lenses. The fifth lens group G5 has at least four positive lenses.

In the projection optical system according to each embodiment of this invention, where Mx2 is an clear aperture of a lens surface of a lens having the largest clear aperture in the second lens group G2, and where Mn3 is an clear aperture of a lens surface of a lens having the smallest clear aperture in the third lens group G3, the following condition (1) is satisfied.

$$1.7 < Mx2/Mn3 < 4 \quad (1)$$

If the upper limit of the condition (1) is exceeded, correction of off-axis aberration becomes difficult, and if the lower limit is exceeded, it is undesirable in terms of correction of chromatic aberration. Preferred boundary values for the upper and lower limits are 3.2 and 1.85, respectively.

Furthermore, where Mx4 is an clear aperture of a lens surface of a lens having the largest clear aperture in the fourth lens group G4, and where Mn4 is an clear aperture of a lens surface of a lens having the smallest clear aperture in the fourth lens group G4, the following condition (2) is satisfied.

$$0.77 < Mn4/Mx4 < 1 \quad (2)$$

The condition (2) specifies a structure of an optical system that has only one significant minimum between the first plane A and the second plane B, which is desirable for correcting chromatic aberrations. If the condition (2) is not met, it is not preferred for the correction of chromatic aberration. A preferred boundary value for the lower limit is 0.8. The upper limit value for this equation is 1 since the condition is smallest/largest.

In addition, it is preferred that at least one lens in the plurality of lenses in the projection optical system has a lens surface with an aspherical shape. With this aspherical effect, it is possible to secure stability with respect to environmental changes and sufficient transmissivity, while keeping the initial image forming performance high.

In this case, the plurality of lenses in the projection optical system preferably include a first aspheric lens having an aspherical shaped lens surface, and a second aspheric lens having an aspherical shaped lens surface. Where D1 is an clear aperture of the lens surface of the first aspheric lens, and where D2 is an clear aperture of the second aspheric lens, it is preferred that the following condition (3) be satisfied.

$$0.8 < D1/D2 < 1.2 \quad (3)$$

The condition (3) specifies a structure in which the diameter of an aspherical surface provided in the projection optical system does not become extremely large. If the condition (3) is not satisfied, the diameter of the aspherical surface provided in the projection optical system becomes too large, so that the production of the aspherical surface becomes difficult, or in cases impossible, which is not preferred in terms of the manufacturing of the projection optical system.

In the projection optical system according to each embodiment of this invention, at least one lens among the plurality of lenses is held such that at least one of its position and orientation(trim) is adjustable. By adjusting at least one of the position or orientation of the lens, the image forming performance of the projection optical system can be corrected.

In the examples shown in FIGS. 1–3, at least one lens in each of the first lens group G1, second lens group G2 and third lens group G3 is held such that at least one of its position and orientation is adjustable. In addition, at least one lens positioned between the first plane A and a lens surface having the smallest clear aperture or a lens having the smallest outer diameter in the second lens group G2, and at least one lens positioned between the second plane B and a lens surface having the smallest clear aperture or a lens having the smallest outer diameter in the second lens group G2, are held such that at least one of the position and orientation is adjustable. Furthermore, at least one lens of the plurality of lenses in the projection optical system that is positioned closer to the first plane A than the aperture stop AS, and at least one lens of the plurality of the lenses in the projection optical system that is positioned closer to the second plane B than the aperture stop AS, are held such that at least one of its position and orientation is adjustable.

In this case, it is preferred that a lens having an aspherical shaped lens surface be held such that at least one of its position and orientation is adjustable. By doing so, imaging characteristics of the projection optical system can be well corrected.

Moreover, in the projection optical system according to each embodiment of this invention, at least one lens positioned between the first plane A and the lens surface having the smallest clear aperture or the lens having the smallest outer diameter in the second lens group G2, and at least one lens positioned between the second lens surface B and the lens surface having the smallest clear aperture or the lens having the smallest outer diameter in the second lens group G2, preferably have a lens surface that is rotationally asymmetric with respect to the optical axis and are held such that at least one of its position and orientation is adjustable. Alternatively, at least one lens of the plurality of lenses in the projection optical system that is positioned closer to the first plane A than the aperture stop AS, and at least one lens of the plurality of lenses in the projection optical system that is closer to the second plane B than the aperture stop AS, preferably have a lens surface that is rotationally asymmetric with respect to the optical axis, and are held such that at least one of its position and orientation is adjustable. By adjusting at least one of the position and orientation of the lens having a lens surface that is rotationally asymmetric with respect to the optical axis, center astigmatism (astigmatism difference on axis) components and anisotropic distortions of the projection optical system can be corrected.

Next, numerical values used in an embodiment of the projection optical system according to this invention are described.

FIG. 1 is an optical path diagram of the projection optical system according to the first embodiment. The projection optical system of this embodiment uses 248.4 nm as a standard wavelength. All of the light transmissive refractive members (lenses L11–L55) in the projection optical system are formed of silica glass (synthetic silica).

As shown in FIG. 1, the projection optical system of the first embodiment has, in order from the first plane A, a first lens group G1 having a negative refractive power, a second lens group G2 having a positive refractive power, a third lens group G3 having a negative refractive power, a fourth lens group G4 having an aperture stop AS in the optical path, and a fifth lens group G5 having a positive refractive power. An clear aperture of a lens surface in the projection optical system, in a direction from the first plane A towards the second plane B, monotonically increases in the first lens group G1, tends to change from increasing to decreasing in the second lens group G2, tends to change from decreasing to increasing in the third lens group G3, and monotonically decreases in the fifth lens group G5. In addition, the clear aperture of the lens surface in the projection optical system becomes a relative maximum in the second lens group G2, a relative minimum in the third lens group G3, and a relative maximum in the third lens group G3 through the fifth lens group G5, while it has only one significant minimum between the first plane A and the second plane B.

From the first plane A, the first lens group G1 has a plano-concave negative lens L11 with its concave surface facing toward the second plane B and a meniscus negative lens L12 with its concave surface facing toward the first plane A. Between these negative lenses L11 and L12, a biconvex air (gas) lens is formed. A lens surface ASP1 on the second plane B of the negative lens L11 is formed in an aspherical shape.

The second lens group G2 has two meniscus negative lenses L21 and L22 with their concave surfaces facing toward the first plane A, two biconvex positive lenses L23 and L24, two meniscus positive lenses L25 and L26 with their convex surfaces facing toward the first plane. A lens surface ASP2 on the second plane B of the positive lens L25 is formed of an aspherical shape.

The third lens group G3 has, from the first plane A, a plano-concave negative lens L31, three biconcave negative lenses L32–L34, and a meniscus negative lens L35 with its concave surface facing toward the first plane A. A lens surface ASP3 on the second plane B side of the negative lens L34 is formed in an aspherical shape.

The fourth lens group G4 has, from the first plane A, a plano-convex positive lens L41 with its convex surface facing toward the second plane B, a biconvex positive lens L42, a biconcave negative lens L43, and a biconvex positive lens L44.

The fifth lens group G5 has, from the first plane A, a biconvex positive lens L51, three meniscus positive lenses L52–L54 with their convex surfaces facing toward the first plane A, and a plane-parallel plate. A lens surface ASP4 on the second plane B of the positive lens L53 is formed of an aspherical shape.

FIG. 2 is an optical path diagram of the projection optical system of the second embodiment. The projection optical system of this embodiment uses 248.4 nm as a standard wavelength. In the second embodiment, all of the light transmissive refractive members (lenses L11–L55) in the projection optical system are formed of a silica glass (synthetic silica).

As shown in FIG. 2, the projection optical system of the second embodiment has, in order from the first plane A, a first lens group G1 having a negative refractive power, a second lens group G2 having a positive refractive power, a third lens group G3 having a negative refractive power, a fourth lens group G4 having an aperture stop AS in the optical path, and a fifth lens group G5 having a positive refractive power. An clear aperture of a lens surface in the projection optical system, in a direction from the first plane A towards the second plane B, monotonically increases in the first lens group G1, tends to change from increasing to decreasing in the second lens group G2, tends to change from decreasing to increasing in the third lens group G3, and monotonically decreases in the fifth lens group G5. In addition, the clear aperture of the lens surface in the projection optical system becomes a relative maximum in the second lens group G2, a relative minimum in the third lens group G3, and a relative maximum in the third lens group G3 through the fifth lens group G5, while it has only one significant minimum between the first plane A and the second plane B.

From the first plane A, the first lens group G1 has a plano-concave negative lens L11 with its concave surface facing toward the second plane B and a meniscus negative lens L12 with its concave surface facing toward the first plane A. Between these negative lenses L11 and L12, a biconvex air (gas) lens is formed. A lens surface ASP1 on the second plane B of the negative lens L11 is formed in an aspherical shape.

The second lens group G2 has two meniscus negative lenses L21 and L22 with their concave surfaces facing toward the first plane A, two biconvex positive lenses L23 and L24, two meniscus positive lenses L25 and L26 with their convex surfaces facing toward the first plane. A lens surface ASP2 on the second plane B of the positive lens L25 is formed of an aspherical shape.

The third group G3 has, from the first plane A, four biconcave negative lenses L31–L34, and a meniscus negative lens L35 having its concave surface facing toward the first plane A. A lens surface ASP3 on the second plane B of the negative lens L34 is formed of an aspherical shape.

The fourth lens group G4 has, from the first plane A, a biconvex positive lens L41, two meniscus positive lenses L42 and L43 with their convex surfaces facing toward the first plane A, and a biconvex positive lens L44.

The fifth lens group G5 has, from the first plane A, a meniscus negative lens L51 with its concave surface facing toward the first plane A, and four meniscus positive lenses L52–L55 with their convex surfaces facing toward the first plane A. A lens surface ASP4 on the second plane B of the positive lens L53 is formed of an aspherical shape.

FIG. 3 is an optical path diagram of a projection optical system of the third embodiment. The projection optical system of this embodiment uses 248.4 nm as a standard wavelength. In the third embodiment, all of light transmissive refractive members (lenses L11–L55) in the projection optical system are formed of a silica glass (synthetic silica).

As shown in FIG. 3, the projection optical system of the third embodiment has, in order from the first plane A, a first lens group G1 having a negative refractive power, a second lens group G2 having a positive refractive power, a third lens group G3 having a negative refractive power, a fourth lens group G4 having an aperture stop AS in the optical path, and a fifth lens group G5 having a positive refractive power. An clear aperture of a lens surface in the projection optical system, in a direction from the first plane A toward the second plane B, monotonically increases in the first lens group G1, tends to change from increasing to decreasing in the second lens group G2, tends to change from decreasing to increasing in the third lens group G3, and monotonically decreases in the fifth lens group G5. In addition, the clear aperture of the lens surface in the projection optical system becomes a relative maximum in the second lens group G2, a relative minimum in the third lens group G3, and a relative maximum in the third lens group G3 through the fifth lens group G5, while it has only one significant minimum between the first plane A and the second plane B.

The first lens group G1 has, from the first plane A, two biconcave negative lenses L11 and L12. Between these negative lenses L11 and L12, a biconvex air (gas) lens is formed. A lens surface ASP1 on the second plane B of the negative lens L11 is formed in an aspherical shape.

The second lens group G2 has, from the first plane A, a biconvex positive lens L21, a meniscus negative lens L22 with its concave surface facing toward the first plane A, a biconvex positive lens L25, and a meniscus positive lens L26 with its convex surface facing toward the first plane A. A lens surface ASP2 on the second plane B of the positive lens L25 is formed of an aspherical shape.

The third lens group G3 has, for the first plane A, a meniscus positive lens L31 with its convex surface facing toward the first plane A, two biconcave negative lenses L34 and L35, and two biconvex positive lenses L36 and L37. A lens surface ASP3 on the second plane B of the positive lens L33 is formed of an aspherical shape. The fourth lens group G4 has, from the first plane A, a biconvex positive lens L41, a biconcave negative lens L42, a biconvex positive lens L43, and a meniscus negative lens L44 with its concave surface facing toward the first plane A.

The fifth lens group G5 has, from the first plane A, four meniscus positive lenses L51–L54 with their convex surfaces facing toward the first plane A, and a meniscus negative lens L55 with its concave surface facing toward the first plane A. A lens surface ASP4 on the second plane B of the positive lens L53 is formed of an aspherical shape.

Parameters of the projection optical system for each of the first to third embodiments are shown in Tables 1–3.

In Tables 1–3, the leftmost column indicates numbers for each lens surface from the first plane A. The second column indicates a curvature radius of each lens surface, and the third column indicates a distance from each lens surface to the next lens surface. The fourth column indicates lens materials, and symbols of the aspherical surface are indicated in the fifth column. The sixth column indicates symbols of each lens, and the seventh column indicates an clear aperture of each lens surface. As an example of units for the curvature radius and distance between surfaces in the parameters of these embodiments, mm can be used. In addition, the curvature radius in the second column for the aspheric lens surfaces indicates a vertex curvature radius.

The aspherical shape is shown with the below equation (a).

At the end of Tables 1 and 2, as Aspheric Surface Data, conical coefficient κ and aspheric coefficients C4, C6, C8, C10, C12 and C14 are indicated for each aspheric surface.

$$Z = \frac{cY^2}{1 + \sqrt{\{1 - (1+\kappa)c^2Y^2\}}} + C4Y^4 + C6Y^6 + C8Y^8 + C10Y^{10} + C12Y^{12} + C14Y^{14} \quad (a)$$

Z: Sag in a direction of the optical axis
Y: Distance from the optical axis (radius direction)
c: Curvature at apex of surface (inverse of curvature radius)
κ: Conical coefficient (κ) (κ=0 when spherical surface)
C4, C6, C8, C10, C12, C14: Aspheric coefficients In the projection optical system of the first to the third embodiments, a silica glass (synthetic silica) is used as the lens material (glass material). In each embodiment, refractive index of the silica glass (synthetic silica) with respect to a standard wavelength of 248.4 nm, an amount of changes (dispersion) in the refractive index of the silica glass per wavelength of 1 pm, and specific gravity of the silica glass, are as follows:

Refractive index of silica glass: 1.50839
Dispersion of silica glass: $-5.6 \times 10^{-7}/+1$ pm
Specific gravity of silica glass: 2.2

The dispersion indicates the amount of change in the refractive index per wavelength of +1 pm. The dispersion being $-5.6 \times 10^{-7}/+1$ pm means that the refractive index decreased by $5.6 \times 10^{-7}$ when the wavelength changed from the standard wavelength by +1 pm.

In the below Tables 1–3, SiO2 indicates a silica glass. NA is a numerical aperture on the second plane B. φ is a radius of an image circle on the second plane B. β is a projection magnification in the entire projection optical system. d0 is a distance from the first plane A to an optical surface (lens surface, reflection surface) closest to the first plane A. WD is a distance (operating distance) from an optical surface closest to the second plane B to the second plane B. ASP1–ASP4 indicate aspherical surfaces, and AS indicates an aperture stop. In each embodiment, the numerical aperture NA in the projection optical system (numerical aperture on the second plane B), the projection magnification β, and the radius φ of an image circle on the second plane B are as follows:

NA=0.82
β=¼
φ=13.2 mm

TABLE 1

First Embodiment (FIG. 1)
D0 = 64.281 (mm)
WD = 10.468 (mm)

| | Curvature radius (mm) | Distance between surfaces/thickness of center (mm) | Glass | Aspherical surface | Lens | Effective aperture (mm) |
|---|---|---|---|---|---|---|
| 1: | ∞ | 25.500 | SiO2 | | L11 | 132.4 |
| 2: | 211.275 | 41.253 | | ASP1 | | 142.1 |
| 3: | −112.355 | 15.000 | SiO2 | | L12 | 145.3 |
| 4: | 1957.054 | 8.327 | | | | 189.9 |
| 5: | −1339.441 | 37.900 | SiO2 | | L21 | 194.9 |
| 6: | −226.291 | 1.000 | | | | 212.3 |
| 7: | −2414.978 | 46.229 | SiO2 | | L22 | 241.9 |
| 8: | −235.640 | 1.000 | | | | 251.9 |
| 9: | 1026.407 | 48.054 | SiO2 | | L23 | 277.9 |
| 10: | −395.138 | 1.000 | | | | 281.2 |
| 11: | 353.730 | 49.482 | SiO2 | | L24 | 281.8 (Mx2) |
| 12: | −1276.637 | 1.000 | | | | 278.2 |
| 13: | 209.039 | 50.371 | SiO2 | | L25 | 250.4 |
| 14: | 875.000 | 1.000 | | ASP2 | | 234.9 |
| 15: | 215.723 | 44.255 | SiO2 | | L26 | 213.0 |
| 16: | 125.930 | 32.223 | | | | 161.7 |
| 17: | ∞ | 17.000 | SiO2 | | L31 | 159.3 |
| 18: | 170.295 | 21.427 | | | | 141.2 |
| 19: | −644.129 | 15.000 | SiO2 | | L32 | 140.4 |
| 20: | 267.780 | 83.890 | | | | 135.5 |
| 21: | −111.250 | 15.000 | SiO2 | | L33 | 135.3 (Mn3) |
| 22: | 766.547 | 11.872 | | | | 155.7 |
| 23: | −503.294 | 53.098 | SiO2 | | L34 | 157.2 |
| 24: | 1355.000 | 18.035 | | ASP3 | | 203.5 |
| 25: | −1349.778 | 36.393 | SiO2 | | L35 | 213.5 |
| 26: | −233.841 | 1.000 | | | | 225.2 |
| 27: | ∞ | 43.709 | SiO2 | | L41 | 253.3 (Mn4) |
| 28: | −279.044 | 1.000 | | | | 260.1 |
| 29: | 298.150 | 55.792 | SiO2 | | L42 | 286.1 (Mx4) |
| 30: | −1235.697 | 12.300 | | | | 284.8 |
| 31: | ∞ | 16.855 | | | AS | 277.2 |
| 32: | −795.958 | 24.000 | SiO2 | | L43 | 277.4 |
| 33: | 278.236 | 27.029 | | | | 274.5 |
| 34: | 500.126 | 58.684 | SiO2 | | L44 | 283.1 |
| 35: | −393.024 | 10.492 | | | | 286.0 |
| 36: | 2955.500 | 32.879 | SiO2 | | L51 | 285.8 |
| 37: | −626.544 | 1.000 | | | | 285.3 |
| 38: | 201.110 | 49.960 | SiO2 | | L52 | 265.1 |
| 39: | 730.074 | 1.000 | | | | 256.6 |
| 40: | 162.066 | 45.261 | SiO2 | | L53 | 223.7 |
| 41: | 280.000 | 5.759 | | ASP4 | | 201.3 |
| 42: | 159.106 | 53.928 | SiO2 | | L54 | 177.4 |

TABLE 1-continued

First Embodiment  (FIG. 1)
D0 = 64.281 (mm)
WD = 10.468 (mm)

| | | | | | |
|---|---|---|---|---|---|
| 43: | 492.581 | 6.294 | | | 130.6 |
| 44: | ∞ | 53.000 | SiO2 | L55 | 125.0 |
| 45: | ∞ | | | | 56.4 |

Aspherical Surface Data

<ASP1>  <ASP2>

| | | | | |
|---|---|---|---|---|
| κ | 0.00000 | | κ | 0.00000 |
| C4 | $-8.99872 \times 10^{-08}$ | | C4 | $1.00733 \times 10^{-08}$ |
| C6 | $1.88253 \times 10^{-12}$ | | C6 | $-9.57452 \times 10^{-14}$ |
| C8 | $-6.92844 \times 10^{-17}$ | | C8 | $2.76746 \times 10^{-19}$ |
| C10 | $6.86429 \times 10^{-21}$ | | C10 | $-2.57352 \times 10^{-23}$ |
| C12 | $-1.21174 \times 10^{-24}$ | | C12 | $7.72339 \times 10^{-28}$ |
| C14 | $7.08409 \times 10^{-29}$ | | C14 | $-4.21223 \times 10^{-32}$ |

<ASP3>  <ASP4>

| | | | | |
|---|---|---|---|---|
| κ | 0.00000 | | κ | 0.00000 |
| C4 | $4.32781 \times 10^{-08}$ | | C4 | $-1.11168 \times 10^{-08}$ |
| C6 | $-7.29382 \times 10^{-13}$ | | C6 | $1.69910 \times 10^{-13}$ |
| C8 | $-1.89306 \times 10^{-17}$ | | C8 | $-1.71278 \times 10^{-18}$ |
| C10 | $1.26587 \times 10^{-21}$ | | C10 | $-2.32359 \times 10^{-22}$ |
| C12 | $-1.84258 \times 10^{-26}$ | | C12 | $5.36170 \times 10^{-28}$ |
| C14 | $0.00000 \times 10^{+00}$ | | C14 | $7.75398 \times 10^{-32}$ |

TABLE 2

Second Embodiment  (FIG. 2)
D0 = 60.533 (mm)
WD = 10.250 (mm)

| | Curvature radius (mm) | Distance between surfaces/thickness of center (mm) | Glass | Aspherical surface | Lens | Effective aperture (mm) |
|---|---|---|---|---|---|---|
| 1: | 456661.760 | 14.007 | SiO2 | | L11 | 130.8 |
| 2: | 257.652 | 35.928 | | ASP1 | | 136.7 |
| 3: | -111.976 | 14.000 | SiO2 | | L12 | 139.3 |
| 4: | -372.001 | 15.312 | | | | 165.9 |
| 5: | -177.016 | 42.312 | SiO2 | | L21 | 169.6 |
| 6: | -192.938 | 1.000 | | | | 208.3 |
| 7: | -1457.639 | 36.216 | SiO2 | | L22 | 237.6 |
| 8: | -267.611 | 1.000 | | | | 245.8 |
| 9: | 1940.558 | 37.760 | SiO2 | | L23 | 267.3 |
| 10: | -430.648 | 1.000 | | | | 271.1 |
| 11: | 688.317 | 36.462 | SiO2 | | L24 | 277.8 (Mx2) |
| 12: | -902.945 | 1.000 | | | | 277.5 |
| 13: | 226.241 | 47.929 | SiO2 | | L25 | 266.9 |
| 14: | 1191.278 | 1.000 | | | | 260.1 |
| 15: | 248.626 | 35.812 | SiO2 | | L26 | 240.4 |
| 16: | 1789.195 | 50.884 | | ASP2 | | 230.7 |
| 17: | -4234.706 | 18.811 | SiO2 | | L31 | 173.9 |
| 18: | 123.779 | 31.361 | | | | 142.2 |
| 19: | -463.315 | 14.000 | SiO2 | | L32 | 140.6 |
| 20: | 210.723 | 97.502 | | | | 134.8 (Mn3) |
| 21: | -115.190 | 17.865 | SiO2 | | L33 | 138.1 |
| 22: | 3048.133 | 14.394 | | | | 159.5 |
| 23: | -306.688 | 55.025 | SiO2 | | L34 | 161.6 |
| 24: | 2288.537 | 12.262 | | ASP3 | | 215.5 |
| 25: | -3110.668 | 37.657 | SiO2 | | L35 | 220.7 |
| 26: | -238.147 | 1.000 | | | | 230.6 |
| 27: | 2784.239 | 49.533 | SiO2 | | L41 | 262.4 (Mn4) |
| 28: | -261.060 | 1.000 | | | | 267.7 |
| 29: | 301.548 | 50.456 | SiO2 | | L42 | 287.3 (Mx4) |
| 30: | 2090.868 | 12.300 | | | | 284.1 |
| 31: | ∞ | 9.305 | | | AS | 282.3 |
| 32: | 9513.104 | 55.412 | SiO2 | | L43 | 281.2 |
| 33: | 271.141 | 27.421 | | | | 276.1 |

TABLE 2-continued

Second Embodiment  (FIG. 2)
D0 = 60.533 (mm)
WD = 10.250 (mm)

| | | | | | |
|---|---|---|---|---|---|
| 34: | 462.725 | 50.112 | SiO2 | L44 | 283.9 |
| 35: | -564.778 | 1.000 | | | 285.6 |
| 36: | -84302.567 | 34.086 | SiO2 | L51 | 285.7 |
| 37: | -509.897 | 1.000 | | | 285.7 |
| 38: | 200.575 | 46.481 | SiO2 | L52 | 264.3 |
| 39: | 648.269 | 1.007 | | | 257.2 |
| 40: | 169.530 | 35.871 | SiO2 | L53 | 227.6 |
| 41: | 279.942 | 8.224 | | ASP4 | 214.2 |
| 42: | 146.299 | 54.467 | SiO2 | L54 | 182.4 |
| 43: | 469.601 | 7.273 | | | 139.5 |
| 44: | 5116.633 | 58.229 | SiO2 | L55 | 132.2 |
| 45: | 1153.136 | | | | 54.8 |

Aspherical Surface Data

<ASP1>  <ASP2>

| | | | | |
|---|---|---|---|---|
| κ | 0.00000 | | κ | 0.00000 |
| C4 | $-9.38125 \times 10^{-08}$ | | C4 | $1.54761 \times 10^{-08}$ |
| C6 | $2.50879 \times 10^{-12}$ | | C6 | $-2.39312 \times 10^{-13}$ |
| C8 | $-6.27999 \times 10^{-17}$ | | C8 | $4.05575 \times 10^{-18}$ |
| C10 | $4.12928 \times 10^{-21}$ | | C10 | $-7.34673 \times 10^{-23}$ |
| C12 | $-2.17575 \times 10^{-25}$ | | C12 | $7.00382 \times 10^{-28}$ |
| C14 | 0.00000 | | C14 | 0.00000 |

<ASP3>  <ASP4>

| | | | | |
|---|---|---|---|---|
| κ | 0.00000 | | κ | 0.00000 |
| C4 | $4.46673 \times 10^{-08}$ | | C4 | $-1.54863 \times 10^{-08}$ |
| C6 | $-6.64292 \times 10^{-13}$ | | C6 | $-2.55751 \times 10^{-14}$ |
| C8 | $-2.78075 \times 10^{-17}$ | | C8 | $1.39035 \times 10^{-19}$ |
| C10 | $1.34132 \times 10^{-21}$ | | C10 | $-1.53962 \times 10^{-22}$ |
| C12 | $-1.05650 \times 10^{-26}$ | | C12 | $-2.14246 \times 10^{-27}$ |
| C14 | $-2.22069 \times 10^{-31}$ | | C14 | $8.42244 \times 10^{-32}$ |

TABLE 3

Third Embodiment  (FIG. 3)
D0 = 53.785 (mm)
WD = 11.251 (mm)

| | Curvature radius (mm) | Distance between surfaces/thickness of center (mm) | Glass | Aspherical surface | Lens | Effective aperture (mm) |
|---|---|---|---|---|---|---|
| 1: | -1389.219 | 25.000 | SiO2 | | L11 | 127.4 |
| 2: | 234.167 | 38.998 | | ASP1 | | 137.9 |
| 3: | -102.435 | 17.000 | SiO2 | | L12 | 140.1 |
| 4: | 1678.662 | 8.983 | | | | 189.1 |
| 5: | 6096.345 | 44.509 | SiO2 | | L21 | 204.4 |
| 6: | -197.984 | 1.003 | | | | 216.7 |
| 7: | -1734.379 | 34.196 | SiO2 | | L22 | 245.1 |
| 8: | -305.392 | 1.011 | | | | 252.5 |
| 9: | 845.430 | 45.398 | SiO2 | | L23 | 274.2 |
| 10: | -425.259 | 2.389 | | | | 276.9 |
| 11: | 315.881 | 35.123 | SiO2 | | L24 | 277.5 (Mx2) |
| 12: | 1240.127 | 4.140 | | | | 274.2 |
| 13: | 377.678 | 36.758 | SiO2 | | L25 | 266.7 |
| 14: | -4217.598 | 1.000 | | ASP2 | | 260.9 |
| 15: | 239.656 | 39.372 | SiO2 | | L26 | 236.0 |
| 16: | 1227.710 | 38.926 | | | | 224.2 |
| 17: | 1415.772 | 21.030 | SiO2 | | L31 | 175.3 |
| 18: | 199.038 | 28.658 | | | | 147.6 |
| 19: | -233.226 | 16.799 | SiO2 | | L32 | 145.0 |
| 20: | 136.280 | 29.897 | | | | 132.0 (Mn3) |
| 21: | 11572.716 | 48.062 | SiO2 | | L33 | 133.6 |
| 22: | 4005.560 | 19.859 | | ASP3 | | 137.3 |
| 23: | -147.265 | 17.000 | SiO2 | | L34 | 137.6 |
| 24: | 288.349 | 21.528 | | | | 156.9 |
| 25: | -1136.286 | 20.564 | SiO2 | | L35 | 165.4 |
| 26: | 460.382 | 13.073 | | | | 190.4 |

TABLE 3-continued

Third Embodiment (FIG. 3)
D0 = 53.785 (mm)
WD = 11.251 (mm)

| | | | | | |
|---|---|---|---|---|---|
| 27: | 13964.940 | 34.001 | SiO2 | L36 | 196.7 |
| 28: | −238.368 | 5.343 | | | 206.6 |
| 29: | 7900.267 | 35.691 | SiO2 | L37 | 236.1 |
| 30: | −303.283 | 10.205 | | | 241.9 |
| 31: | 281.108 | 51.587 | SiO2 | L41 | 275.8 |
| 32: | −1499.268 | 40.580 | | | 274.9 |
| 33: | −1199.144 | 17.000 | SiO2 | L42 | 265.6 |
| 34: | 249.770 | 41.000 | | | 261.1 (Mn4) |
| 35: | ∞ | 0.919 | | AS | 261.3 |
| 36: | 495.786 | 37.966 | SiO2 | L43 | 276.7 |
| 37: | −1137.747 | 15.324 | | | 278.7 |
| 38: | −2097.155 | 36.793 | SiO2 | L44 | 282.8 |
| 39: | −367.624 | 1.000 | | | 286.3 (Mx4) |
| 40: | 230.000 | 40.103 | SiO2 | L51 | 286.2 |
| 41: | 413.404 | 1.000 | | | 278.9 |
| 42: | 234.229 | 41.871 | SiO2 | L52 | 271.0 |
| 43: | 803.282 | 3.792 | | | 264.1 |
| 44: | 154.591 | 45.408 | SiO2 | L53 | 225.4 |
| 45: | 395.911 | 7.175 | | ASP4 | 210.8 |
| 46: | 138.759 | 47.541 | SiO2 | L54 | 171.9 |
| 47: | 261.540 | 10.750 | | | 128.4 |
| 48: | −2223.234 | 49.636 | SiO2 | L55 | 122.9 |
| 49: | −1482.603 | | | | 59.4 |

Aspherical Surface Data

| <ASP1> | | <ASP2> | |
|---|---|---|---|
| κ | 0.00000 | κ | 0.00000 |
| C4 | −1.22769 × 10$^{-07}$ | C4 | 5.48518 × 10$^{-09}$ |
| C6 | 3.91902 × 10$^{-12}$ | C6 | −3.71287 × 10$^{-14}$ |
| C8 | 1.54573 × 10$^{-16}$ | C8 | −6.54689 × 10$^{-19}$ |
| C10 | 5.81458 × 10$^{-21}$ | C10 | 1.54179 × 10$^{-23}$ |
| C12 | 0.00000 | C12 | 0.00000 |
| C14 | 0.00000 | C14 | 0.00000 |

| <ASP3> | | <ASP4> | |
|---|---|---|---|
| κ | 0.00000 | κ | 0.00000 |
| C4 | 2.48721 × 10$^{-08}$ | C4 | 4.78408 × 10$^{-09}$ |
| C6 | −2.70011 × 10$^{-12}$ | C6 | 2.28738 × 10$^{-14}$ |
| C8 | −1.40184 × 10$^{-16}$ | C8 | −8.67747 × 10$^{-18}$ |
| C10 | −2.90417 × 10$^{-21}$ | C10 | 1.63825 × 10$^{-22}$ |
| C12 | 0.00000 | C12 | 0.00000 |
| C14 | 0.00000 | C14 | 0.00000 |

Values corresponding to conditions of the first to third embodiments are shown in Tables 4 and 5. In Table 4, Mx2 is an clear aperture (mm) of a lens surface having the largest clear aperture in the second lens group G2, and Mn3 indicates an clear aperture (mm) of a lens surface having the smallest clear aperture in the third lens group. In addition, in Table 5, Mx4 is an clear aperture (mm) of a lens surface having the largest clear aperture in the fourth lens group, and Mn4 is an clear aperture (mm) of a lens surface having the smallest clear aperture in the fourth lens group. In Table 6, D1 is an clear aperture (mm) of a lens surface of the first aspheric lens, and D2 is an clear aperture (mm) of the second aspheric lens.

TABLE 4

| | Mx2 (mm) | Mn3 (mm) | Mx2/Mn3 |
|---|---|---|---|
| First Embodiment: | 281.8 | 135.3 | 2.08 |
| Second Embodiment: | 277.8 | 134.8 | 2.06 |
| Third Embodiment: | 277.5 | 132.0 | 2.10 |

TABLE 5

| | Mn4 (mm) | Mx4 (mm) | Mn4/Mx4 |
|---|---|---|---|
| First Embodiment: | 253.3 | 286.1 | 0.89 |
| Second Embodiment: | 262.4 | 287.3 | 0.91 |
| Third Embodiment: | 261.1 | 286.3 | 0.91 |

TABLE 6

| | D1 (mm) | D2 (mm) | D1/D2 |
|---|---|---|---|
| First Embodiment (1): | 234.9 (ASP2) | 201.3 (ASP4) | 1.17 |
| First Embodiment (2): | 234.9 (ASP2) | 203.5 (ASP3) | 1.15 |
| First Embodiment (3): | 201.3 (ASP4) | 203.5 (ASP3) | 0.99 |
| Second Embodiment (1): | 230.7 (ASP2) | 214.2 (ASP4) | 1.08 |
| Second Embodiment (2): | 230.7 (ASP2) | 215.5 (ASP3) | 1.07 |
| Second Embodiment (3): | 214.2 (ASP4) | 215.5 (ASP3) | 0.99 |
| Third Embodiment (1): | 137.9 (ASP1) | 137.3 (ASP3) | 1.00 |
| Third Embodiment (2): | 210.8 (ASP4) | 260.9 (ASP2) | 0.81 |

From the data obtained from Tables 4 and 5, it is understood that conditions (1) and (2) are met in each of the first to third embodiments. In addition, from the data obtained Table 6, it is understood that condition (3) is met in each of the first to third embodiments.

Next, diagrams showing aberrations on the second plane with a wavelength of 248.4 nm in the projection optical system of the first to third embodiments are shown in FIGS. 4–9.

Figures 5A, 5B, 5C:
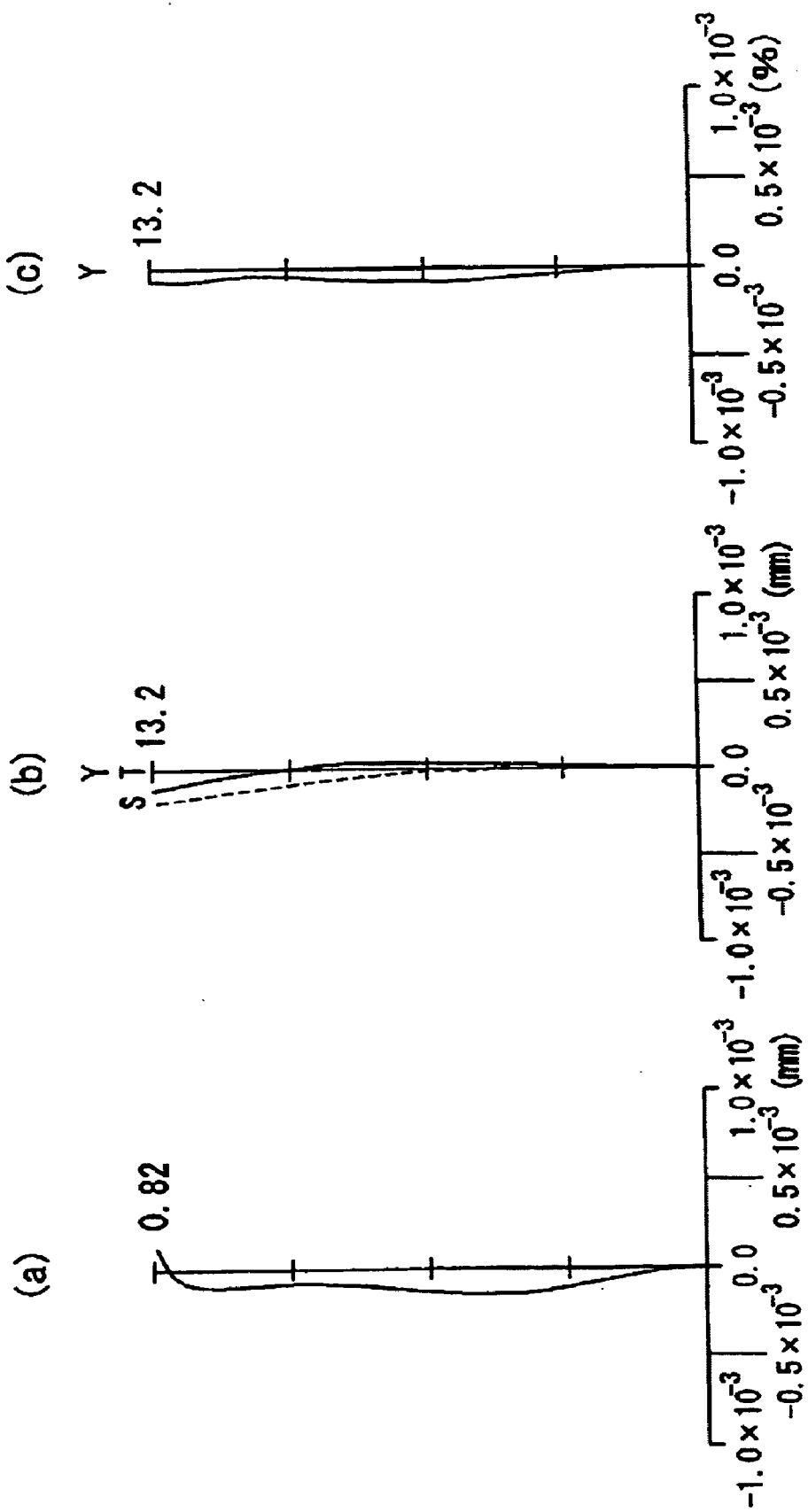
FIG. 5 shows various aberration diagrams of the projection optical system of the second embodiment of this invention.
Figure 7:
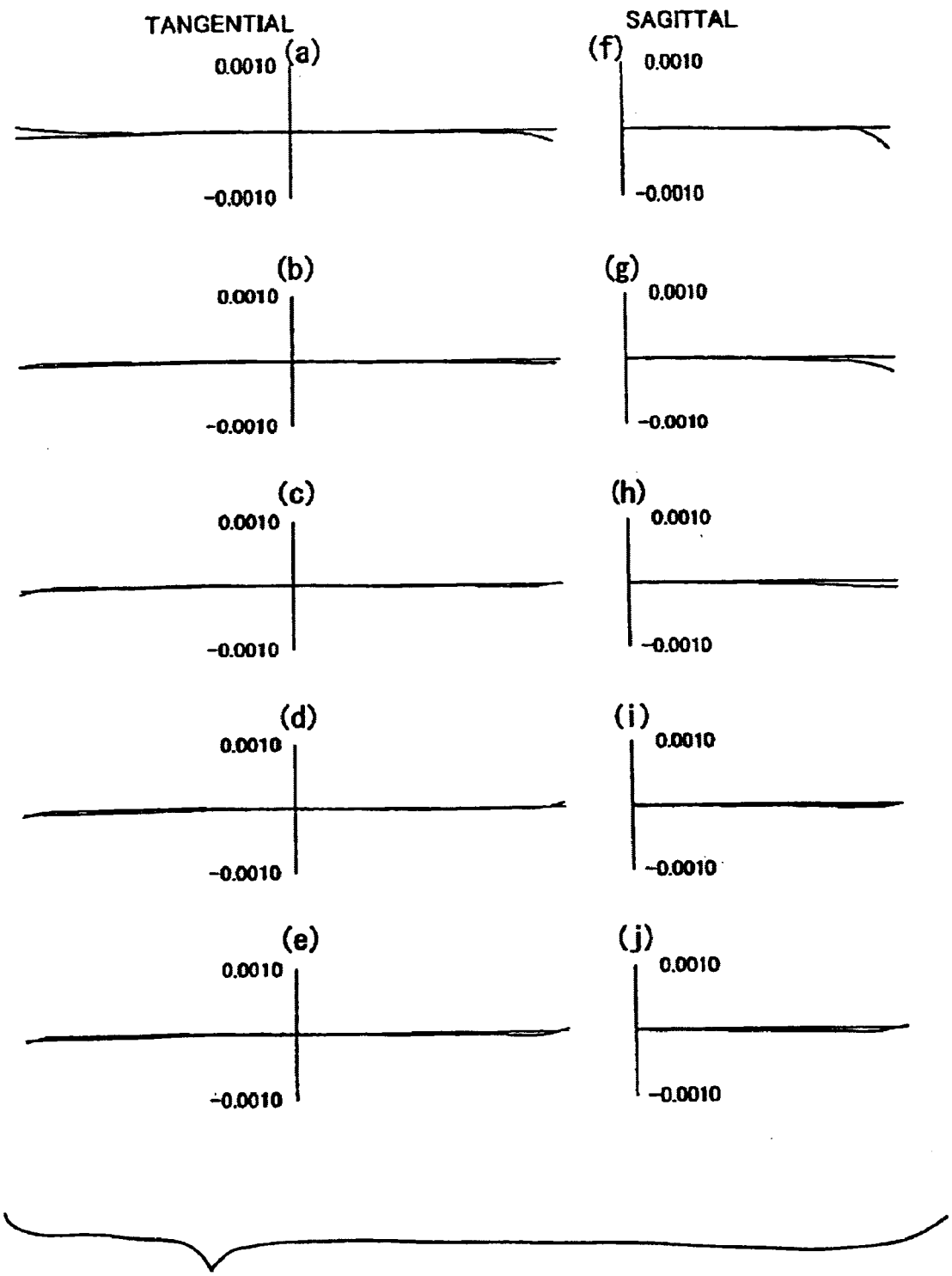
FIG. 7 shows lateral aberration diagrams of the projection optical system of the first embodiment of this invention.
Figure 8:
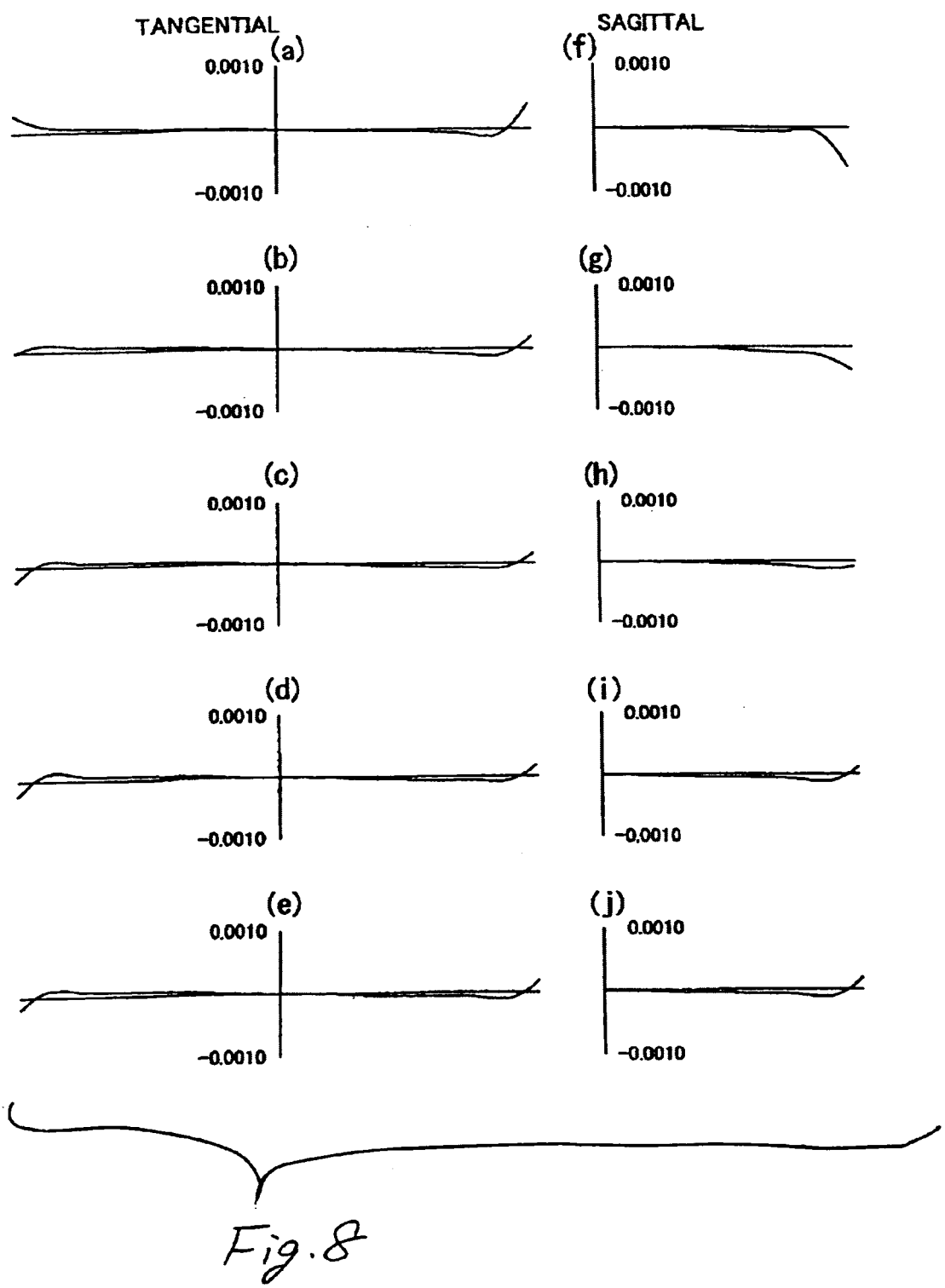
FIG. 8 shows lateral aberration diagrams of the projection optical system of the second embodiment of this invention.
Figure 9:
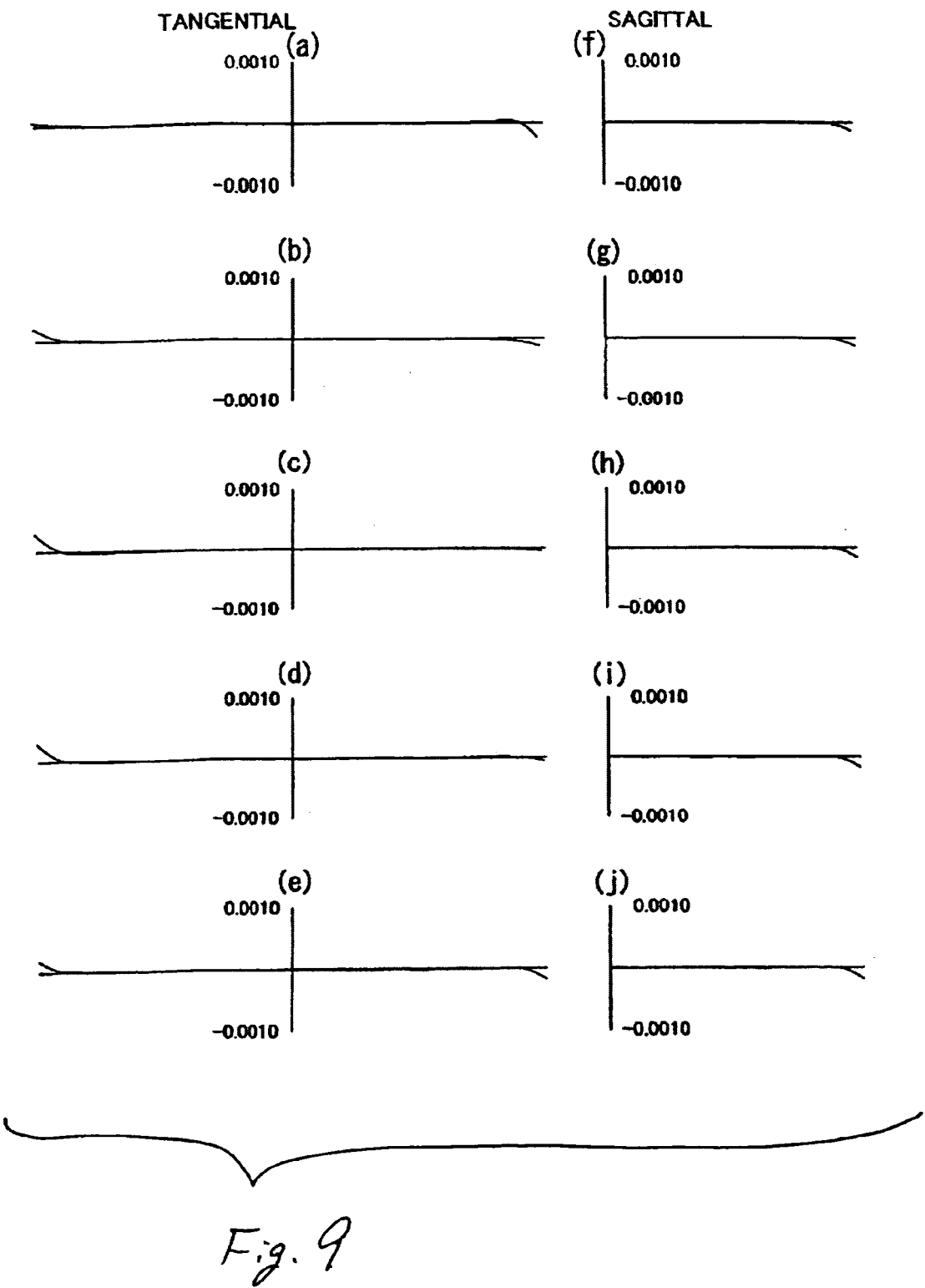
FIG. 9 shows lateral aberration diagrams of the projection optical system of the third embodiment of this invention.

FIGS. 4A, 5A and 6A are spherical aberration diagrams, FIGS. 4B, 5B and 6B are astigmatism diagrams, and FIGS. 4C, 5C and 6C are distortion aberration diagrams. Charts (a)–(e) in FIGS. 7–9 indicate lateral aberrations (coma) in a meridional direction (tangential direction), and charts (f)–(j) indicate coma in a sagittal direction. In each aberration diagram, NA indicates a number aperture on an image side (the second plane) of the projection optical system, and Y indicates a height of an image on the second plane. In addition, in the astigmatism diagram shown in FIGS. 4B, 5B and 6B, a broken line indicates a meridional (tangential) image, and a solid line indicates a sagittal image. Each of the charts (a) in FIGS. 7–9 is a diagram showing a horizontal aberration in the meridional direction at the image height Y=13.2. Each of the charts (b) in FIGS. 7–9 is a diagram showing a horizontal aberration in the meridional direction at the image height Y=9.9. Each of the charts (c) in FIGS. 7–9 is a diagram showing a horizontal aberration in the meridional direction at the image height Y=6.6. Each of the charts (d) in FIGS. 7–9 is a diagram showing a horizontal aberration in the meridional direction at the image height Y=3.3. Each of the charts (e) in FIGS. 7–9 is a diagram showing a horizontal aberration in the meridional direction at the image height Y=0 (on the optical axis). Each of the charts (f) in FIGS. 7–9 is a diagram showing a horizontal aberration in the sagittal direction at the image height Y=13.2. Each of the charts (g) in FIGS. 7–9 is a diagram showing a horizontal aberration in the sagittal direction at the image height Y=9.9. Each of the charts (h) in FIGS. 7–9 is a diagram showing a horizontal aberration in the sagittal direction at the image height Y=6.6. Each of the charts (i) in FIGS. 7–9 is a diagram showing a horizontal aberration in the sagittal direction at the image height Y=3.3. Each of the charts (j) in FIGS. 7–9 is a diagram showing a horizontal aberration in the sagittal direction at the image height Y=0 (on the optical axis).

As is clear from each of the aberration diagrams, in the projection optical system of the embodiments, good correction of aberrations is achieved in a range from where the image height is 0 and where the image height is maximum. Therefore, by assembling the projection optical system of the embodiments in an exposure apparatus, it is possible to transfer extremely fine patterns onto wafers. Since the projection optical system of the embodiments has a circular image field with a diameter of 26.4, it is possible to secure a rectangular exposure area in the image field that has a width of approximately 8.8 in the scan direction and a width of approximately 25 in the direction orthogonal to the scan direction, or a rectangular exposure area that has a width of approximately 8 in the scan direction and a width of approximately 26 in the direction orthogonal to the scan direction. Units for the image height and the image field are mm if mm are to be used as the units for the curvature radius and space between lens surfaces. In the projection optical system of the embodiments, chromatic aberrations are corrected in a range of 0.5 pm at FWHM (full width at half maximum), which makes it possible to reduce load to the light source of the exposure apparatus when assembling the projection optical system of these embodiments in the exposure apparatus.

Figure 10:
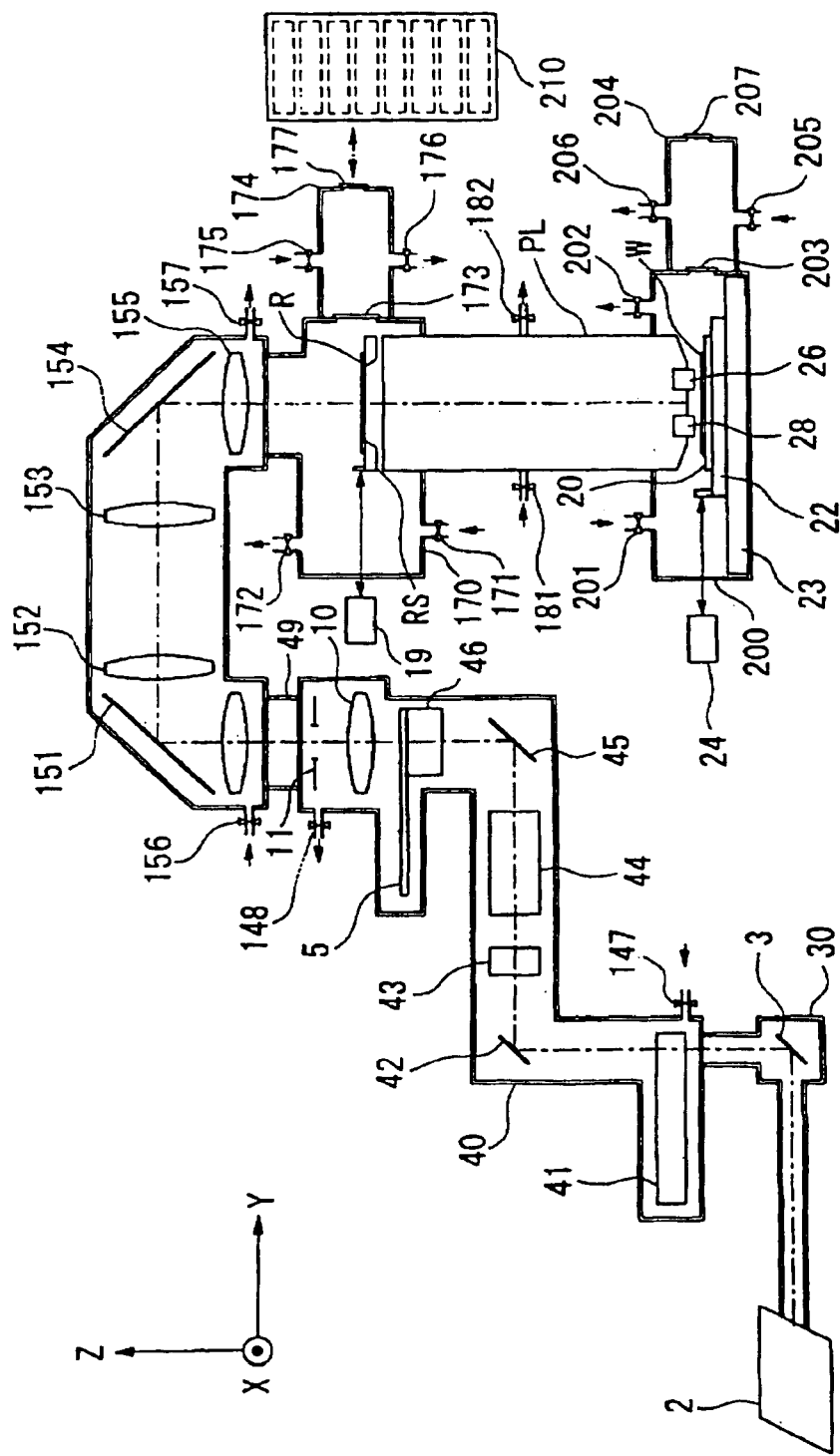
FIG. 10 is a structural diagram of an exposure apparatus according to embodiments of this invention.

The projection optical system of the above described first to third embodiments can be applied in a projection exposure apparatus in an embodiment shown in FIG. 10. Forms of the embodiment of the exposure apparatus according to this invention are described below with reference to FIG. 10. FIG. 10 is a diagram showing a schematic construction of the projection exposure apparatus according to the embodiment. In FIG. 10, an XYZ orthogonal coordinate system is used. In the XYZ orthogonal coordinate system, the X and Y axes are configured such that a workpiece (photosensitive substrate) becomes parallel with respect to a wafer stage 22 that holds a wafer W, and the Z axis is configured in a direction orthogonal to the wafer stage (a direction parallel to an optical axis AX in a projection optical system PL). Actually, in the XYZ orthogonal coordinate system shown in the figure, an XY plane is set on a surface parallel to the horizontal plane, and the Z axis is set in a direction perpendicular [to the XY plane].

In the exposure apparatus according to the embodiment, this invention is applied by using a KrF excimer laser light source as an exposure light source and any of dioptric type projection optical system of the above described first to third embodiments as the projection optical system PL. In the projection exposure apparatus of this embodiment, a step-and-scan method is employed, in which a pattern image of a reticle R used as a projection original is sequentially transcribed in one shot region on a wafer, by synchronously scanning the reticle R and the wafer W in a predetermined direction with relative to an illumination area of a predetermined shape on the reticle R. In this type of the step-and-scan type exposure apparatus, a patter of the reticle R can be exposed in a region on a substrate (wafer W) larger than an exposure field of the projection optical system.

In FIG. 10, a laser source 2 is a KrF excimer laser that outputs a pulse ultraviolet light having an oscillation wavelength of 248 nm, for example. The laser source 2 of this embodiment is not limited to the KrF excimer laser, but an ArF excimer laser that has an oscillation wavelength of 192 nm, or a laser generating light in a vacuum ultraviolet region that has a wavelength of approximately 120 nm–approximately 180 nm, such as a fluoride dimer laser ($F_2$ laser) with an oscillation wavelength of 157 nm, a krypton dimer laser ($Kr_2$ laser) with an oscillation wavelength of 146 nm, and an argon dimer laser ($Ar_2$ laser) with an oscillation wavelength of 126 nm, may be used.

Pulse laser light (illumination light) from the laser light source 2 is deflected by a deflecting mirror 3, goes to an optical path delay optical system 41, and is temporarily divided into a plurality of light beams with an optical path length difference of the temporal time coherence length or more of the illumination light from the laser light source 2. Furthermore, this type of optical path delay optical system is disclosed in, for example, Japanese Laid-Open Patent Applications 1-198759 and 11-174365.

After illumination light emitted from the optical path delay optical system 41 is deflected by an optical path deflecting mirror 42, it reaches a second fly's eye lens 46 via a first fly's eye lens 43, a zoom lens 44, and an oscillation mirror 45 in order. On the emitting side of the second fly's eye lens 46, a switching revolver 5 for an illumination optical system aperture stop is arranged to set a desired size and shape of an effective light source. In this example, in order to reduce a light amount loss in the illumination optical system aperture stop, the size of the light beam to the second fly's eye lens 46 through the zoom lens 44 is variable.

The light beam emitted from an aperture stop of the illumination optical system illuminates an illumination field stop (reticle blind) 11 via a condenser lens group 10. Furthermore, the illumination field stop 11 is disclosed in Japanese Laid-Open Patent Application 4-196513 and the corresponding U.S. Pat. No. 5,473,410.

The light from the illumination field stop 11 is guided to the reticle R via an illumination field stop imaging optical system (reticle blind imaging system) formed of deflecting mirrors 151 and 154 and lens groups 152, 153 and 155, and an illumination region which is an image of an aperture part of the illumination field stop 11 is formed on the reticle R. The light from the illumination region on the reticle R is guided onto the wafer W via the projection optical system PL, and a reduced image of a pattern within the illumination region of the reticle R is formed on the wafer W. A reticle stage RS which holds the reticle R is two-dimensionally movable within an XY plane, and its position coordinates are measured by an interferometer 19 and position-controlled. Furthermore, a wafer stage 22 which holds the wafer W is also two-dimensionally movable within the XY plane, and its position coordinates are measured by an interferometer 24 and position-controlled. Within this arrangement, the reticle and the substrate can be synchronously scanned with high accuracy.

If light in an ultraviolet or vacuum ultraviolet region is used as the exposure light, a gas (hereafter referred to as "absorptive gas"), such as oxygen, vapor, hydro-carbon system gas, or the like, having a strong absorption characteristic with respect to the light of the related wavelength band region needs to be eliminated. Therefore, in this embodiment, an illumination optical path (optical path from the laser light source 2 to the reticle R) and the projection optical path (optical path from the reticle R to the wafer W) are shielded from outside atmosphere, and the optical paths are filled with a mixed gas (hereafter referred to as "low absorptive gas" or "specified gas"), such as nitrogen, helium, argon, neon, krypton, or the like, as a specified gas having a characteristic with less absorption with respect to the light of the vacuum ultraviolet region.

Specifically, the optical path from the laser light source 2 to the optical path delay optical system 41 is shielded by a casing 30 from outside atmosphere. The optical path from the optical path delay optical system 41 to the illumination field stop 11 is shielded by a casing 40 from outside atmosphere, the illumination field stop imaging optical system is shielded by a casing 150 from outside atmosphere, and the above-mentioned specified gas is filled within the optical paths. The casings 40 and 150 are connected to a casing 49. Furthermore, a lens barrel of the projection optical system PL itself is a casing, and the above-mentioned specified gas is filled in the internal optical path.

Furthermore, it is preferable that nitrogen or helium is used as a specified gas, which is filled in the respective optical paths. The nitrogen has strong light absorption characteristics for light having a wavelength of approximately 15 nm or less, and the helium has strong characteristics of light absorption characteristics for light having a wavelength of approximately 100 nm or less. The helium has a thermal conductivity that is six times more than that of nitrogen and has an amount of change in refractivity with respect to changes in air pressure that is as little as ⅛ of that of nitrogen. Therefore, helium is superior especially for high transmissivity and for stability and cooling ability of imaging characteristics of the optical system. In addition, the helium can be used as the specified gas for a lens barrel of the projection optical system PL, and the nitrogen can be used as the specified gas for other optical paths (e.g., an illumination optical path from the laser light source 2 to the reticle R).

The casing 170 shields a space between the projection optical system PL and the casing 150 which stores the illumination field stop imaging optical system from outside atmosphere and stores the reticle stage RS which holds the reticle R. In this casing 170, a door 173 is set for loading and ejecting the reticle R. Outside the door 173, a gas chamber 174 is provided which prevents atmosphere within the casing 170 from being polluted when the reticle R is loaded and ejected. A door 177 is arranged in this gas chamber 174 as well. Reticle transfer in the reticle stocker 210 which stores plural types of reticles is performed via the door 177.

The casing 200 shields the space between the projection optical system PL and the wafer W from outside atmosphere. Inside the casing 200, a wafer stage 22 which holds the wafer W via a wafer holder 20, an oblique incidence auto focus sensor 26 which detects an inclination angle and a position (focus position) in a Z direction of a surface of the wafer W as a substrate, and an off-axis alignment sensor 28, and a holding plate 23 which mounts the wafer stage 22 are stored. In this casing 200, a door 203 is provided for loading and ejecting the wafer W. Outside this door 203, a gas chamber 204 is provided which prevents atmosphere inside the casing 200 from being polluted. In the gas chamber 204, a door 207 is provided. Loading and ejecting of the wafer W into/out of the apparatus can be performed via this door 207.

Here, gas supply valves 147, 156, 171 and 201 are arranged in the casings 40, 150, and 170 and 200, respectively. These gas supply valves 147, 156, 171 and 201 are connected to undepicted air supply piping connected to a gas supply apparatus. Additionally, the casings 40, 150, 170 and 200 are provided with exhaust valves 148, 157, 172 and 202, respectively. These exhaust valves 148, 157, 172, and 202 are connected to the above-mentioned gas supply apparatus via undepicted exhaust piping. Furthermore, a specified gas from the gas supply apparatus is controlled by an undepicted temperature adjusting apparatus to a predetermined target temperature. Here, when helium is used as a specified gas, it is preferable that the temperature adjusting apparatus be arranged in the vicinity of the respective casings.

In the same manner, gas supply valves 175 and 205 and exhaust valves 176 and 206 are also arranged in the gas chambers 174 and 204, respectively. Gas supply valves 175 and 205 are connected to the above-mentioned gas supply apparatus via air supply piping, and the exhaust valves 176 and 206 are connected to the above-mentioned gas supply apparatus via the exhaust piping. Furthermore, an gas supply valve 181 and an exhaust valve 182 are also arranged in the lens barrel of the projection optical system PL, and the gas supply valve 181 is connected to the above-mentioned gas supply apparatus via an undepicted air supply piping, and the exhaust valve 182 is connected to the above-mentioned gas supply apparatus via an undepicted exhaust piping.

Furthermore, in the air supply piping in which the gas supply valves 147, 156, 171, 175, 181, 201, and 205 are arranged and exhaust piping in which the exhaust valves 148, 157, 172, 176, 182, 202, and 206 are arranged, a filter which removes particles, such as an HEPA filter, or a ULPA filter and a chemical filter which removes an absorptive gas such as oxygen or the like are arranged.

Additionally, in the gas chambers 174 and 204, gas exchange is needed when the reticle or wafer is replaced. For example, in the case of reticle exchange, the door 177 is opened, the reticle is loaded from the reticle stocker 210 to the gas chamber 174, the door 177 is closed, and the gas chamber 174 is filled with a specified gas. After that, the door 173 is opened, and the reticle is mounted on the reticle stage RS. Furthermore, in the case of wafer exchange, the door 207 is opened, the wafer is loaded in the gas chamber 204, the door 207 is closed, and the gas chamber 204 is filled with a specified gas. After that, the door 203 is opened, and the wafer is mounted on the wafer holder 20. Additionally, when the reticle and the wafer are transferred out, the procedure is reversed. Furthermore, in the case of gas exchange to the gas chambers 174 and 204, after atmosphere within the gas chambers is evacuated, a specified gas also can be supplied from gas supply valves.

In addition, in the casings 170 and 200, there is a possibility that a gas in which gas was exchanged by the gas chambers 174 and 204 is mixed, and there is a high possibility that a large amount of absorptive gas such as oxygen or the like is mixed in the gas of the gas chambers 174 and 204. It is desirable that gas exchange is performed at the same timing as the gas exchange of the gas chambers 174 and 204. Furthermore, it is preferable that a specified gas with a pressure higher than outside atmosphere is filled in the casings and the gas chambers.

In the embodiments, at least one lens of the plurality of lenses structuring the projection optical system PL is held such that at least one of its position and orientation is adjustable. Because of this, imaging characteristics of the projection optical system PL can be corrected. In the embodiments, an environment inside and outside the projection optical system PL is measured. Based on the results of measurement, the lens(es) of the projection optical system PL is(are) driven, and at least one of the position and orientation of the lens(es) is adjusted to correct the imaging characteristics of the projection optical system PL.

Figure 11:
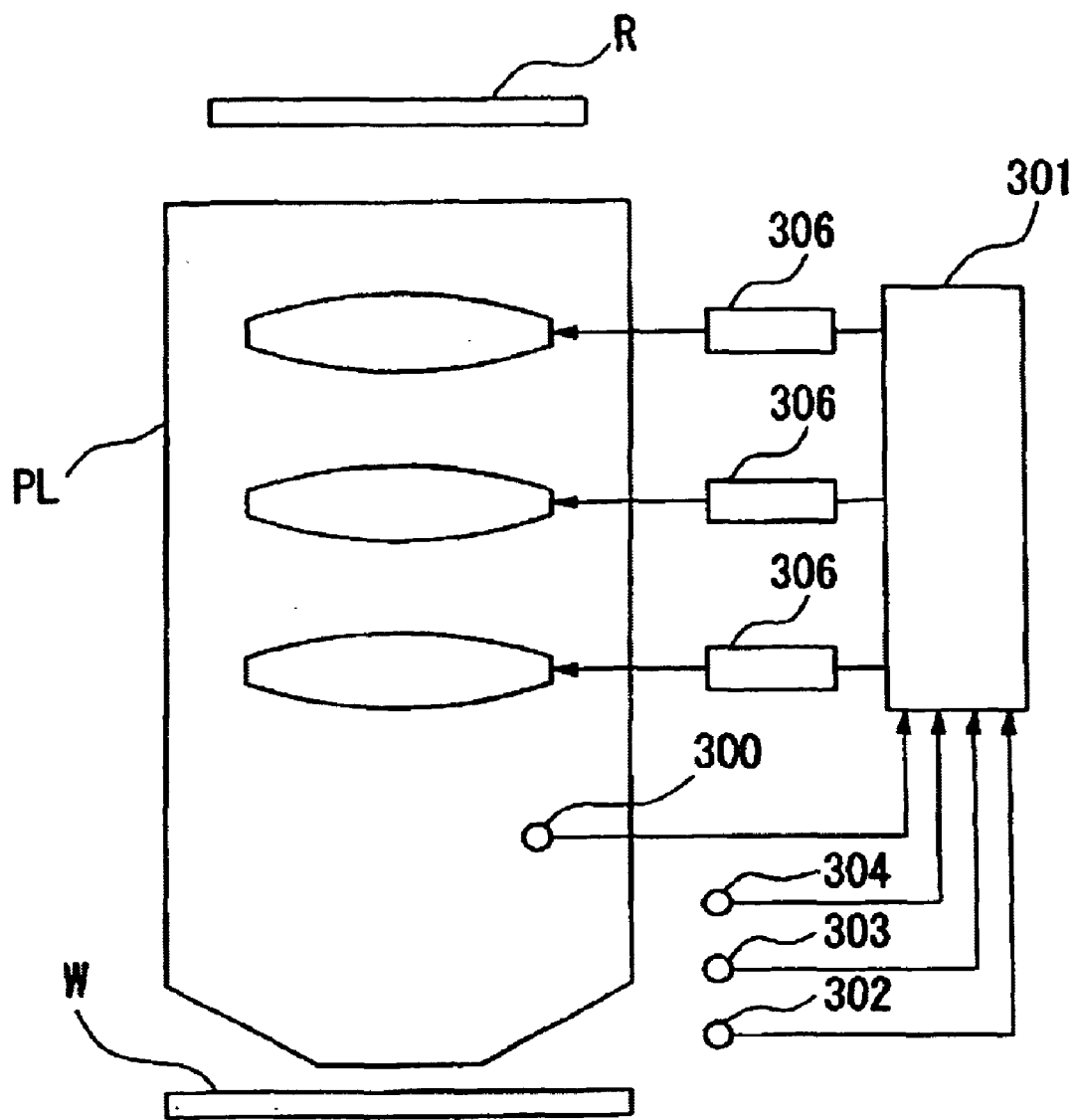
FIG. 11 is a control block diagram for correction of imaging characteristics.

FIG. 11 is a control block diagram related to the above described correction of the imaging characteristics.

In FIG. 11, an air (gas) pressure sensor 300 is provided inside the projection optical system PL (inside a lens barrel) as a mechanism for measuring the environmental conditions. Values measured by the air pressure sensor 300 are supplied to a main control system 301. In addition, information of temperature, air pressure and humidity of a gas surrounding the projection optical system PL measured by a temperature sensor 302, an air (gas) pressure sensor 303 and a humidity sensor 304, respectively, are also supplied to the main control system 301. By driving a specified lens in the projection optical system PL by a drive unit 306 (actuator), the main control system 301 adjusts at least one of the position and orientation of a lens. That is, the main control system 301 pre-stores the relationships of changes in the environmental conditions inside and outside the projection optical system PL and the image formation characteristics (various aberrations) of the projection optical system PL and measures the environment using each of the sensors 300, 302–304 at a predetermined timing. Based on the measurement information and pre-stored data, at least one of the position and orientation of the lens is adjusted such that the imaging characteristics become most preferable at that time. Measurement of the changes in the environmental conditions is not limited to the above described method for directly measuring the actual environment inside and outside the projection optical system PL, but an indirect cause may be measured that can be a cause for the changes in the environment, such as an amount of irradiation of the exposure illumination light. In that cause, the changes in the environment, such as changes in temperature, can be presumed by calculating and storing the amount of irradiation of the exposure illumination light, for example.

The drive unit 306 that drives the lens(es) can be a freely extendable/retractable drive element that is formed of, for example, a piezoelectric element (piezo-element) or the like. FIGS. 12A and 12B are diagrams showing an example of a mechanism for driving a lens using the drive element. In FIGS. 12A and 12B, a lens L is held by a lens frame 310, which is held by three drive elements 311a, 311b and 311c positioned equally at azimuthal degrees of 120°. The main control system 301 extends and retracts the three drive elements 311a–311c independently in the Z axis (a direction of the optical axis AX), by individually controlling the drive voltage for each of the drive elements 311a, 311b and 311c. When the amounts of extension and retraction of the three drive elements 311a–311c in the Z-axis direction are the same, the lens L moves in the Z-axis direction (the direction of the optical axis AX), and when the amounts of extension and retraction of the three drive elements 311a–311c in the Z-axis direction are different, the lens L tilts with respect to the XY plane perpendicular to the Z axis (tilting about an axis parallel with the X axis, and about an axis parallel with the Y axis). Moreover, at points where the drive elements 311a–311c are positioned, undepicted position sensors, and information of the amount of extraction and retraction by the drive elements 311a–311c detected by these position sensors is supplied to the main control system 301. The main control system 301 controls the drive voltage for the drive elements 311a–311c, by for example, a closed loop method, such that the detected amounts of extraction and retraction become target values. For the position sensor, a static capacitor type gap sensor, an optical or magnetic type linear encoder or an interferometer, for example, may be used. In addition, for the drive unit that drives the lens, another actuator may be used, such as magnetostriction actuator or a hydropneumatic actuator, instead of the piezoelectric element.

FIG. 13 is a diagram showing another example of the mechanism for driving the lens. In FIG. 13, three lenses L1, L2 and L3 of a plurality of lenses structuring the projection optical system are each held drivably by drive units 315–317, respectively, that include freely extendable/retractable drive elements consisting of piezoelectric elements (piezo-element, etc.) or the like. As described with respect to FIG. 12, each of the drive units 315–317 is composed of three drive elements and can move the respective lenses L1–L3 along the direction of the optical axis AX (Z-axis direction) of the projection optical system, and it can tilt the respective lenses L1–L3 with respect to the XY plane perpendicular to the optical axis AX. Furthermore, in the example shown in FIG. 13, the structure is made in which the lenses L1 and L2 (lens frames 321 and 322) of the three lenses L1–L3 are accumulated on the lowest lens L3 via the drive units 315–317.

In case of the structure shown in FIG. 13, the three lenses L1–L3 are driven together by the lowest drive unit 317. Because of this, there is an advantage that the lenses L1–L3 can be driven together while maintaining the positional relationships of the lenses L1–L3, by extending and retracting the drive element of the drive unit 317. In contrast, in the case of the structure in which a plurality of lenses are held individually freely movable with respect to each other, there is an advantage that the amount of driving of the plurality of lenses is reduced as a whole since, for example, by driving only one lens, spaces with respect to the above and below lenses are changed simultaneously. Each lens discussed above may be structured from a single lens element or a lens group in which a plurality of lens elements are combined. Whether each lens in the projection optical system PL may be driven together or independently may be determined by the amount of driving of each lens and a precision of stability in the position required to each lens for correcting the imaging characteristics for the projection optical system PL. However, in this embodiment, for the purpose of individually correcting a specified number of aberrations generated in the projection optical system PL, the structure in which a specified number of lenses in the projection optical system PL are each driven individually is used.

Here, it becomes possible to individually correct the specified number of various aberrations by moving in the Z-axis direction (direction of optical axis AX) the lenses at least equal to or more than the number of various aberrations subject to correction, and by tilting them about an axis parallel to the X axis and about the axis parallel with the Y axis. In this embodiment, by relating and adjusting the position and orientation of one of the five lenses in the projection optical system PL or by adjusting the position and orientation of some of the lenses, magnification, distortion (distortion aberration), coma, field curvature aberration, and spherical aberration can be individually corrected. The above-described technique that corrects the aberrations by adjusting the position and orientation of the lens are disclosed in, for example, Japanese Laid-Open Patent Application 11-195602. Moreover, the mechanism that moves lenses in the Z-axis direction (direction of optical axis AX) and tilts the lenses about the axis parallel with the X axis and about the axis parallel with the Y axis is disclosed in each of Japanese Laid-Open Patent Application 9-106499, Japanese Laid-Open Patent Application 10-206714, and Japanese Laid-Open Patent Application 11-44834. Furthermore, the mechanism that tilts the lenses about the axis parallel with the X axis and about the axis parallel with the Y axis is also disclosed in Japanese Laid-Open Patent Application 2000-235134 and 2000-249886.

The adjustment of the position and orientation of a lens for correcting the imaging characteristics of the projection optical system is not limited to adjusting the position of the lens in the Z-axis direction (direction of optical axis AX) and the tilting of the lens about the axis parallel with the X axis and about the axis parallel with the Y axis. That is, it is preferable to adjust eccentricity of the plurality of lenses in the projection optical system PL by moving (shifting) at least one of the lenses in the XY plane perpendicular to the optical axis, in addition to the above-described adjustment of the orientation. Here, regarding the adjustment of the position and orientation of the lens, means for adjusting the position of the lens in the Z direction (direction of optical axis AX) and the tilts of the lens about the axis parallel to the X axis and about the axis parallel to the Y axis is a first adjustment means, and means for adjusting the position of the lens in the XY plane perpendicular to the optical axis is a second adjustment means.

For the adjustment of the lens position using the second adjustment means, it is preferable to have a lens that is different from the lens whose position and orientation are adjusted by the first adjustment means, be the subject for adjustment. In addition, it is preferable to relate at least two of the plurality of lenses in the projection optical system and adjust them at the same time. The adjustment of lens position by the second adjustment means has a main purpose to correct imaging characteristics of the projection optical system that remain from the correction of the imaging characteristics using the adjustment by the first adjustment means. That is, by combining the adjustment of the position and orientation of the lens using the first adjustment means and the adjustment of the lens position using the second adjustment means, the imaging characteristics of the projection optical system can be corrected with high accuracy. Similar to the first adjustment means, it is preferred that the driving of the second adjustment means be controlled based on a result of measurement of environment inside and outside the projection optical system. For a basic mechanism for the second adjustment means that moves the lens in the XY plane perpendicular to the optical axis, techniques disclosed in, for example, Japanese Laid-Open Patent Application 2000-206385 can be used.

Moreover, it is preferable to adjust a position of rotation of at least one of the plurality of lenses in the projection optical system that has a lens surface rotationally asymmetrical with respect to the optical system, by rotating the lens with respect to the optical system, in addition to the adjustment of the position and orientation of the lenses using the first adjustment means and the second adjustment means. The means for adjusting the position of rotation of the lens is a third adjustment means. Using the third adjustment means, center astigmatism (astigmartism difference on axis) in the projection optical system can be corrected. Here, the center astigmatism components are astigmatusm difference generated at the center in the projection regions(at the optical axis) of the projection optical system. The anisotropic distortion is an aberration in which imaging magnification is different in the predetermined tangential direction and in a tangential direction perpendicular to the predetermined tangential direction. As a lens surface that is rotationally asymmetrical with respect to the optical axis, a toric surface in which a radius of curvature in the X direction and a radius of curvature in the Y direction are different.

Figure 14A:
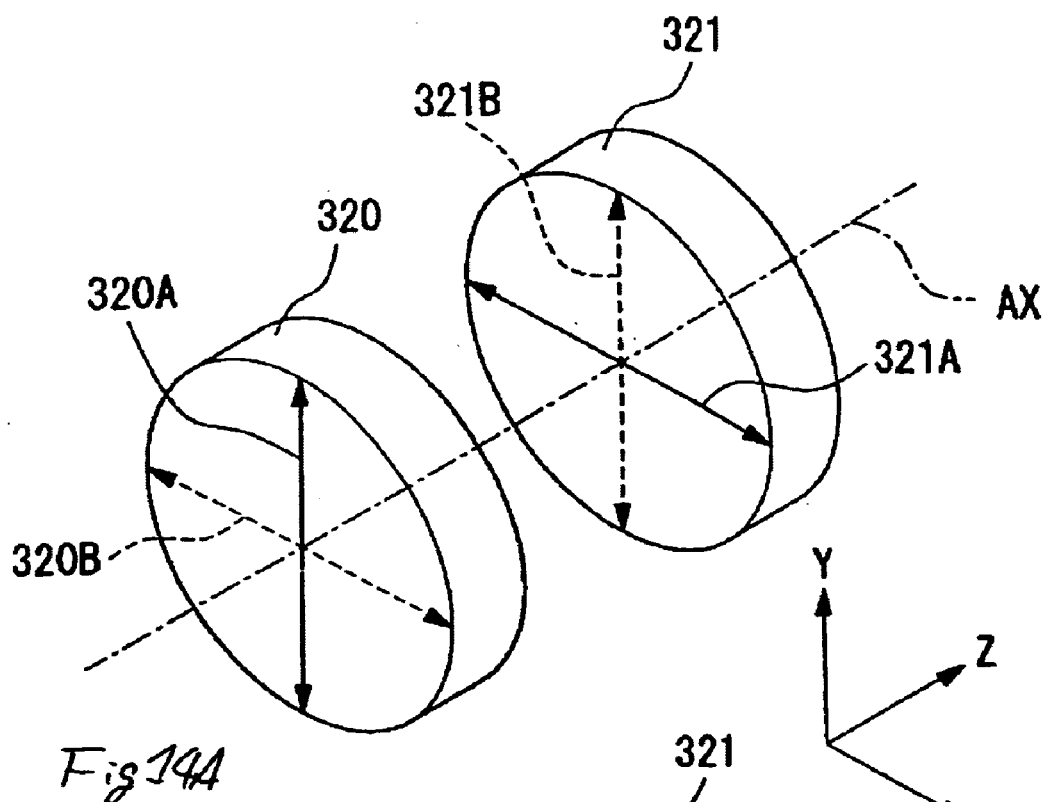
FIG. 14 are diagrams explaining a concept of correcting center aspherical component.
Figure 14B:
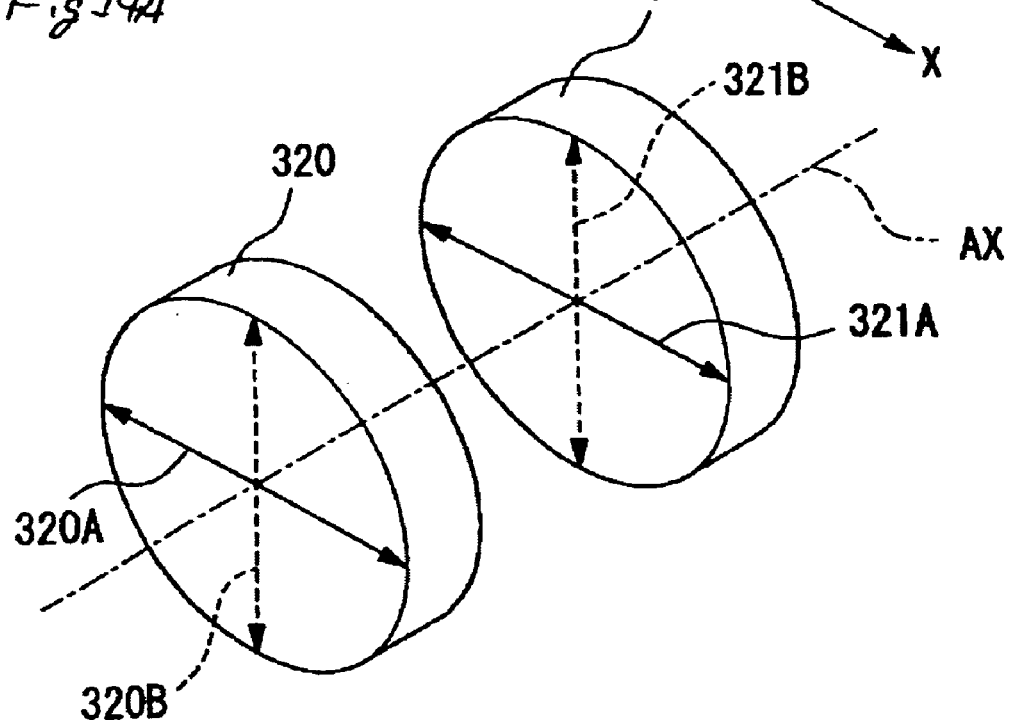

A concept that center astigmatism components are corrected using a lens on which a toric surface is formed, is briefly described. FIGS. 14A and 14B are diagrams for explaining the concept for correcting the center astigmatism components. In FIGS. 14A and 14B, lenses 320 and 321 are a part of lenses structuring the projection optical system PL. At least one of the lenses 320 and 321 is provided so as to be rotatable with respect to the optical axis AX. The lenses 320 and 321 have respective directions 320A and 321A in which the radius of curvature is the largest and directions 320B and 321B that is orthogonal to the directions 320A and 321A and in which the radius of curvature becomes the smallest. Here, refractive powers of the lenses 320 and 321 becomes strongest in the directions 320A and 321A indicated by solid lines in the drawings, and the refractive powers of the lenses 320 and 321 are the weakest in the directions 320B and 321B indicated by dotted lines in the drawings. Below, the directions 320A and 321A in which the radius of curvature (refractive power) becomes strongest are called a strong main meridian, and the directions 320B and 321B in which the radius of curvature (refractive power) becomes weakest are called a weak main meridian.

As shown in FIG. 14A, when the strong main meridians 320A and 321A mutually form 90° in the two lenses 320 and 321, there are no center astigmatism components or anisotropic distortions generated from the lenses 320 and 321. In addition, as shown in FIG. 14B, when the angle formed from the strong main meridians 320A and 321A is shifted from 90° in the lenses 320 and 321, on-axis astigmatic difference components and/or anisotropic distortions are generated with an amount corresponding to the angle formed by the strong main meridians 320A and 321A.

Therefore, for example, by making the lens surfaces of two of the lenses structuring the projection optical system PL to have a shape having different power in the predetermined tangential direction and in the direction orthogonal to the tangential direction and by making the lenses relatively rotatable about the optical axis AX, one of the center astigmatism components and the anisotropic distortions can be corrected. Furthermore, by making lens surfaces of two lenses that are different from the above two lenses to have a shape having power that is different in the predetermined tangential direction and in the direction orthogonal to the tangential direction, and by making the lenses relatively rotatable about the optical system, both the center astigmatism components and anisotropic distortions can be corrected. It is preferable to provide the lens surfaces for adjusting an amount of the center astigmatism components generated near a pupil of the projection optical system, and it is preferable to provide the lens surfaces for adjusting an amount of the anisotropic distortions generated near an object plane or an image plane. The technique for adjusting the center astigmatism components and the anisotropic distortions are disclosed in, for example, Japanese Laid-Open Patent Application 7-183190, Japanese Laid-Open Patent Application 8-327895, and Japanese Laid-Open Patent Application 2000-164489.

Figure 15:
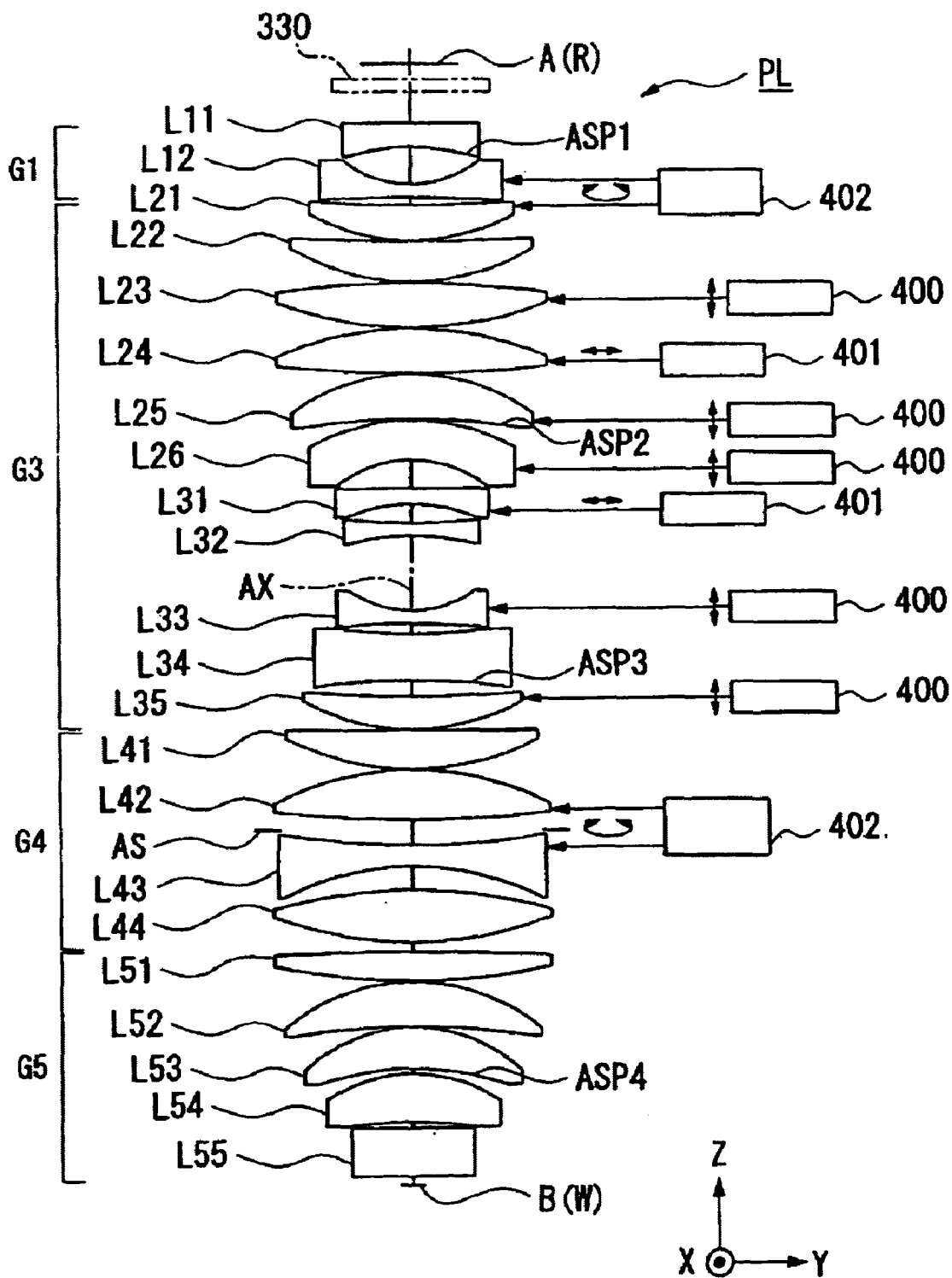
FIG. 15 is a diagram showing an example of a lens structure and an example of an arrangement of lenses whose position and orientation can be adjusted, applied to the projection optical system in the embodiments of this invention.
Figure 16:
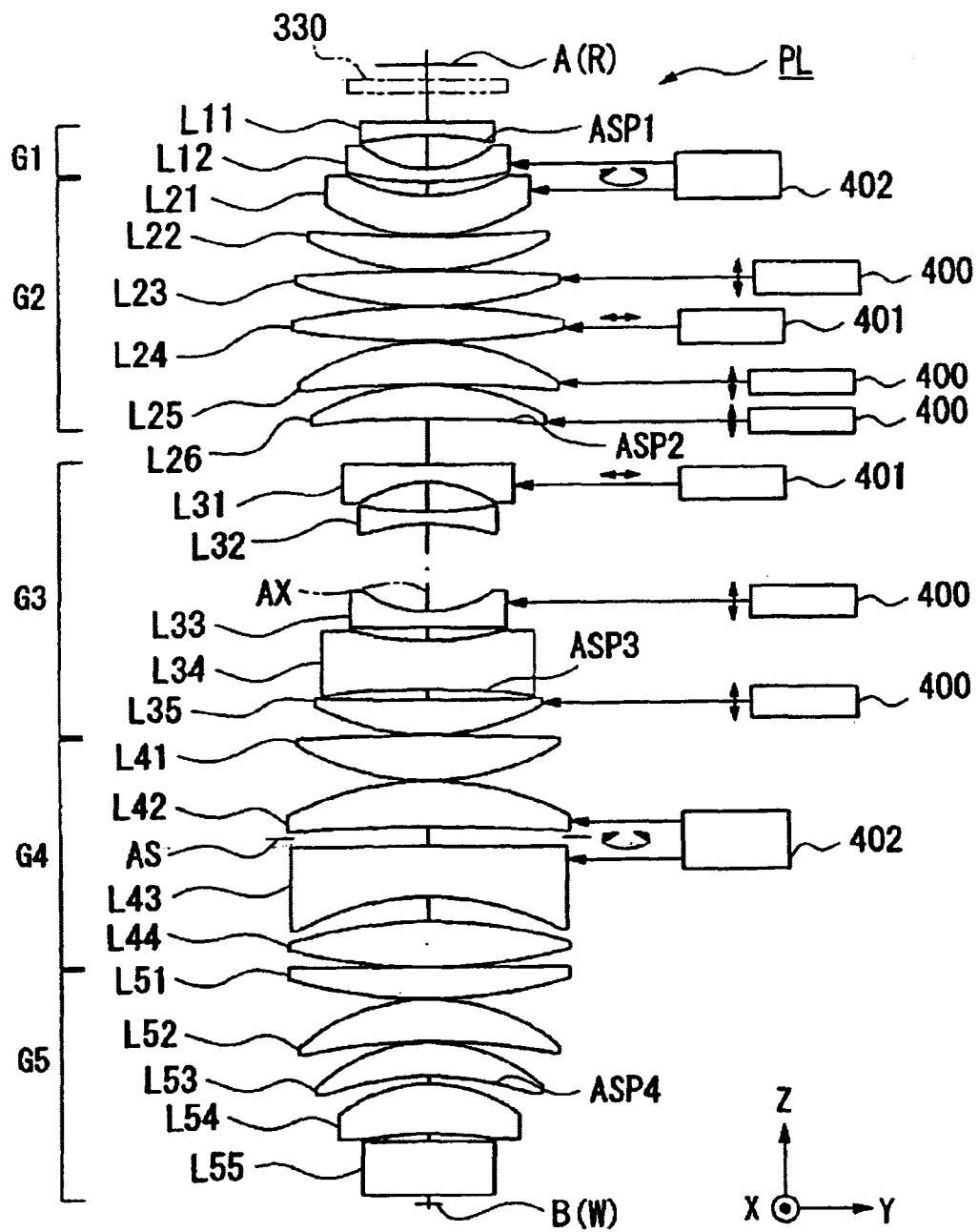
FIG. 16 is a diagram showing another example of a lens structure and an example of an arrangement of lenses whose position and orientation can be adjusted, applied to the projection optical system in the embodiments of this invention.
Figure 17:
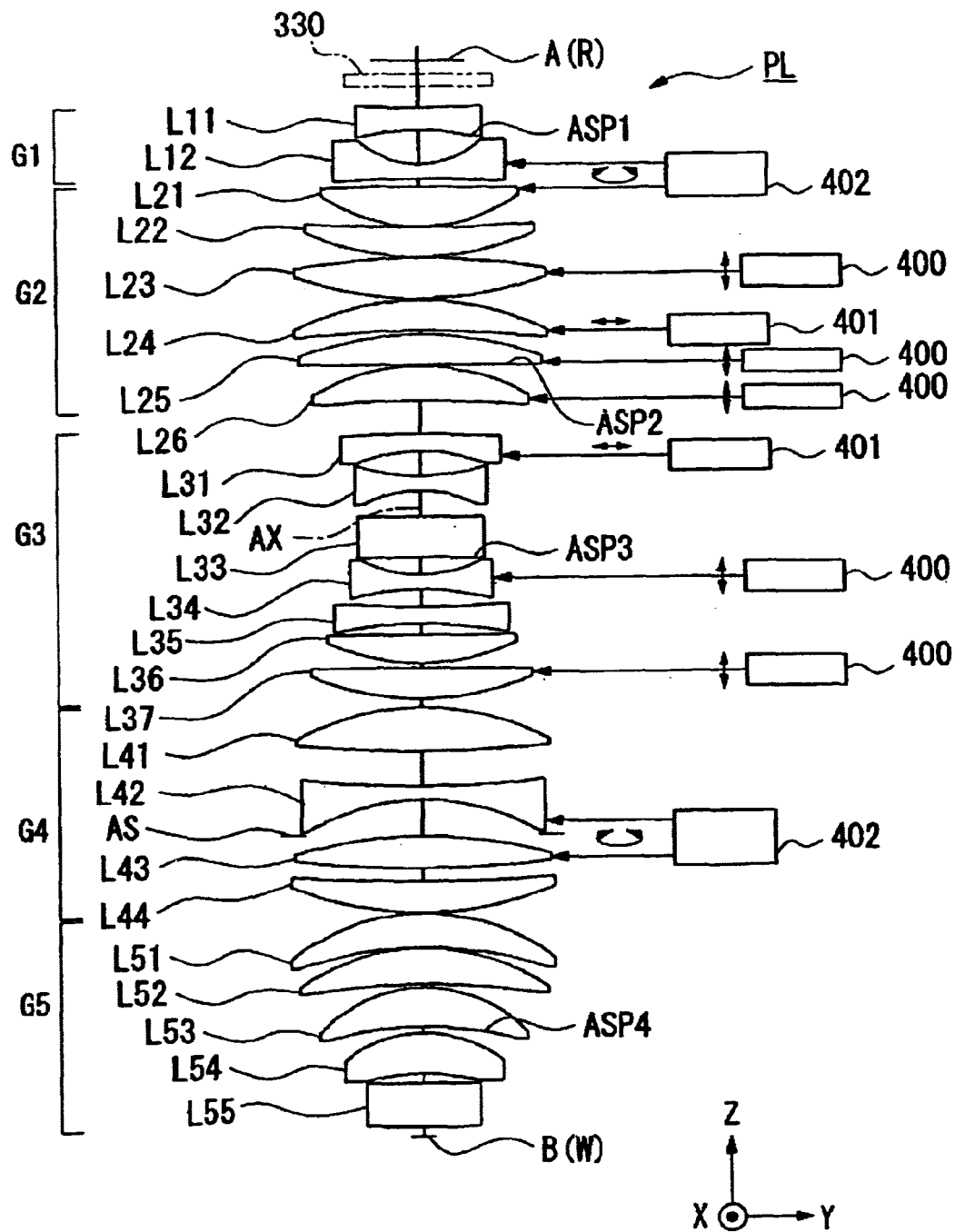
FIG. 17 is a diagram showing another example of a lens structure and an example of an arrangement of lenses whose position and orientation can be adjusted, applied to the projection optical system in the embodiments of this invention.

FIGS. 15, 16 and 17 are drawings showing an exemplary arrangement of lenses of which the position and orientation are adjustable by the first, second and third adjustment means, in the projection optical system PL in which the projection optical system of the first to third embodiments of this invention is applied. In the figures, reference numeral 400 indicates the first adjustment means, reference numeral 401 indicates the second adjustment means, and reference numeral 402 indicates the third adjustment means.

In the projection optical system PL of the first embodiment shown in FIG. 15, for the three positive lenses L23, L25 and L26 in the second lens group G2 and the two negative lenses L33 and L35 in the third lens group G3, adjustments of the position in the Z-axis direction (direction of the optical axis AX) and tilt about the axis parallel to the X axis and about the axis parallel to the Y axis become possible by the first adjustment means 400. In addition, for the positive lens L24 in the second lens group G2 and the negative lens L31 in the third lens group G3, adjustment of position in the XY plane perpendicular to the optical axis becomes possible by the second adjustment means 401.

Furthermore, for the negative lens L12 of the first lens group G1, the negative lens L21 in the second lens group G2, and the positive lens L42 and the negative lens L43 in the fourth lens group G4, adjustment of rotational position becomes possible by the third adjustment means 402.

In the projection optical system of the second embodiment shown in FIG. 16, for the three positive lenses L23, L25 and L26 in the second lens group G2 and the two negative lenses L33 and L35 in the third lens group G3 shown in FIG. 2, adjustments of the position in the Z-axis direction (direction of the optical axis AX) and tilt about the axis parallel to the X axis and about the axis parallel to the Y axis become possible by the first adjustment means 400. In addition, for the positive lens L24 in the second lens group G2 and the negative lens L31 in the third lens group G3, adjustment of position in the XY plane perpendicular to the optical axis becomes possible by the second adjustment means 401. Furthermore, for the negative lens L12 of the first lens group G1, the negative lens L21 in the second lens group G2, and the two positive lenses L42 and L43 in the fourth lens group G4, adjustment of rotational position becomes possible by the third adjustment means 402.

In the projection optical system of the third embodiment shown in FIG. 17, for the three positive is lenses L23, L25 and L26 in the second lens group G2 and the negative lens L33 and the positive lens L35 in the third lens group G3 shown in FIG. 3, adjustments of the position in the Z-axis direction (direction of the optical axis AX) and tilt about the axis parallel to the X axis and about the axis parallel to the Y axis become possible by the first adjustment means 400. In addition, for the positive lens L24 in the second lend group G2 and the negative lens L31 in the third lens group G3, adjustment of position in the XY plane perpendicular to the optical axis becomes possible by the second adjustment means 401. Furthermore, for the negative lens L12 in the first lens group G1, the negative lens L21 in the second lens group G2, and the negative lens L42 and the positive lens L43 in the fourth lens group G4, adjustment of rotational position becomes possible by the third adjustment means 402.

In other words, in this embodiment, in each of the projection optical systems PL shown in FIGS. 15–17, the position and orientation of at least one lens in each of the first lens group GI to the fourth lens group G4 can be adjusted by any of the first to third adjustment means 400–402. In addition, the position and orientation of at least one lens positioned between the first plane A and the lens surface having the smallest clear aperture in the third lens group G3 and at least one lens positioned between the second plane B and the lens surface having the smallest clear aperture in the third lens group G3 are adjustable by any of the first to third adjustment means 400–402. Furthermore, at least one lens positioned between the first plane A and the lens surface having the smallest clear aperture in the third lens group G3 and at least one lens positioned between the second plane B and the lens surface having the smallest clear aperture in the third lens group G3 has a lens surface that is rotationally asymmetrical with respect to the optical axis, and the rotational position thereof is adjustable by the third adjustment means 402. Furthermore, at least one of the position and orientation of at least one of the plurality of lenses in the projection optical system PL positioned closer to the first plane A than the aperture stop AS and at least one of the plurality of lenses in the projection optical system PL positioned closer to the second plane B than the aperture stop AS is adjustable by any of the first to third adjustment means 400–402. Moreover, at least one of the plurality of lenses in the projection optical system PL positioned closer to the first plane A than the aperture stop AS and at least one of the plurality of lenses in the projection optical system PL positioned closer to the second plane than the aperture stop AS have a lens surface that is rotationally asymmetrical with respect to the optical axis, and the rotational position thereof is adjustable by the third adjustment means 402. In addition, the position and orientation of at least one of the lenses having an aspherical shaped lens surface (ASP2), of the plurality of lenses in the projection optical system PL are adjustable by the first adjustment means 400. Then, by adjusting the position and orientation of the lenses, the imaging characteristics of the projection optical system PL can be corrected.

Especially, in this embodiment, because the imaging characteristics of the projection optical system PL can be corrected by measuring the environment inside and outside of the projection optical system PL and by adjusting at least one of the position and orientation of the lens, changes in the imaging characteristics of the projection optical system PL due to changes in the environmental conditions can be controlled.

A method of correcting the imaging characteristics of the projection optical system PL is not limited to the above described adjustment of the position and orientation of the lenses, but a parallel plate 330 can be provided on a side of the wafer W or of the reticle R of the projection optical system PL, and the position and orientation of the parallel plate can be adjusted via an undepicted drive unit. In this case, by using a parallel plate on which a minute roughness is formed on the surface, it is possible to correct especially non-rotational symmetric components of distortions among the aberrations that the entire projection system PL has. It is also possible to correct eccentric coma by providing a parallel plate on the wafer W side of the projection optical system PL and by adjusting its position in the Z axis direction and the angle of inclination of the parallel plate.

In addition, as disclosed in Japanese Laid-Open Patent Application 9-329742, for example, the imaging characteristics of the projection optical system PL can be corrected by changing power of at least one of the surfaces of an optical member (e.g., the parallel plate 330 shown in FIGS. 15–17) positioned in the optical path on the side of the wafer W or the reticle R of the projection optical system PL. In this case, the above-described power may be adjusted by replacing it with an optical member having a different power. By so doing, the field curvature aberrations can be well corrected without affecting telecentricity of the projection optical system PL.

Figure 18:
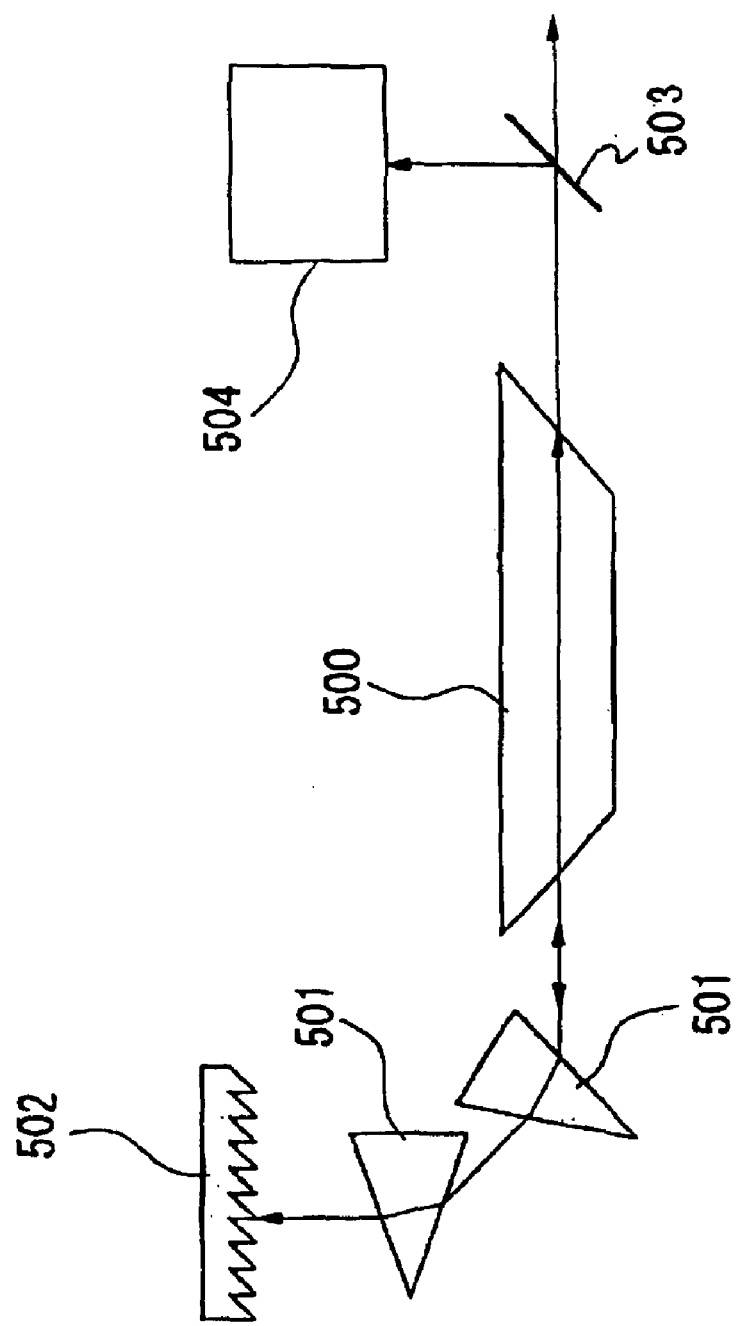
FIG. 18 is a diagram showing an example of a structure of an excimer laser used as a light source of a projection exposure apparatus.

Moreover, for a method of correcting the imaging characteristics of the projection optical system PL, other than the method for changing the position and/or orientation of the optical members, such as lenses and parallel plates, a technique is known which changes the wavelength of oscillation of the light source (laser source) of the exposure light. Japanese Laid-Open Patent Application 11-352012 and Japanese Laid-Open Patent Application 2000-75493, for example, disclose a technique to reduce the changes in the imaging characteristics caused by changes in refractive index of air. Furthermore, techniques for positively correcting the imaging characteristics of a projection optical system by shifting the wavelength of oscillation of the light source are disclosed in, for example, Japanese Laid-Open Patent Application 7-245251. In FIG. 18, an exemplary structure of an excimer laser used in this embodiment is shown. By having light generated by a laser chamber 500 pass and return through prisms 501 and a reflection type diffraction grating 502, only light having a specified wavelength is selected and oscillated to narrow a band of its spectrum. The laser beam having the narrowed band is irradiated from the laser chamber 500, and the wavelength thereof is measured by a wavelength monitor S504 using an etalon or the like, via a half mirror 503. In addition, the wavelength of oscillation is changed by controlling the angle of the prisms 501 and/or the reflection type diffraction grating 502. Since the refractive index of the optical member changes due to changes in the wavelength of light and air pressure, by changing the wavelength of oscillation of the laser beam such that the changes of refractive index of a lens caused by the changes in, for example, the refractivity of air are cancelled, reduction of the imaging characteristics of the projection optical system can be controlled.

Examples of correcting the imaging characteristics based upon the environment inside and outside of the projection optical system PL are described above. Using the method described above, imaging characteristics of the projection optical system that are changed when the illumination conditions change can be corrected. For instance, in FIG. 10, when changing the illumination condition, a focal length of the zoom lens 44 and/or types of a switching revolver 5 for an aperture stop of the illumination optical system is changed via an undepicted drive unit. In accordance with the operation for this change, the imaging characteristics of the projection optical system are changed using at least one of the above described first to third adjustment means. With this technique, the most optimum imaging characteristics can be achieved according to the changes in the illumination conditions. In this case, it is preferable to predetermine the relationships between the illumination condition (shape and size of two-dimensional light source, σ value, type of reticle, etc.) and the amount for driving the adjustment means.

The method for correcting the imaging characteristics of the projection optical system PL explained above should be applied mainly for a purpose of further increasing the imaging characteristics of the projection optical system after substantially assembling the projection optical system and the projection exposure apparatus. In contrast, in the projection optical system, various adjustments are made such that desired imaging characteristics can be obtained at the initial stage of assembly or a stage where the assembly is performed for a certain level. For the adjustments performed from the assembly stage, there are, for example, adjustment of spaces between lenses, eccentric adjustment of lens groups structured from a plurality of lenses, adjustment of spaces between lens groups, and changing lenses. Because of this, the projection optical system has a structure in which the plurality of lenses structuring the projection optical system are held such that at least one of the position and orientation thereof is adjustable, so that various adjustments can be made. For the structure of the projection optical system, for example, a structure may be applied which includes lens barrel members separated such that each of them holds a plurality of lenses or one lens, and in which a washer, which is a thickness adjustment member, can be replaceablly inserted between adjacent lens barrel members. In this case, by replacing washers having different thickness, the position and orientation of a lens in the optical axis direction can be adjusted to correct the imaging characteristics of the projection optical system. Techniques related to correcting the imaging characteristics of the projection optical system using washers are disclosed in, for example, Japanese Laid-Open Patent Application 10-54932.

Next, an example of an operation for obtaining a semiconductor device as a micro device by forming a predetermined circuit patterns on a wafer using a projection exposure apparatus of the above embodiment is described with reference to a flow chart in FIG. 19.

Figure 19:
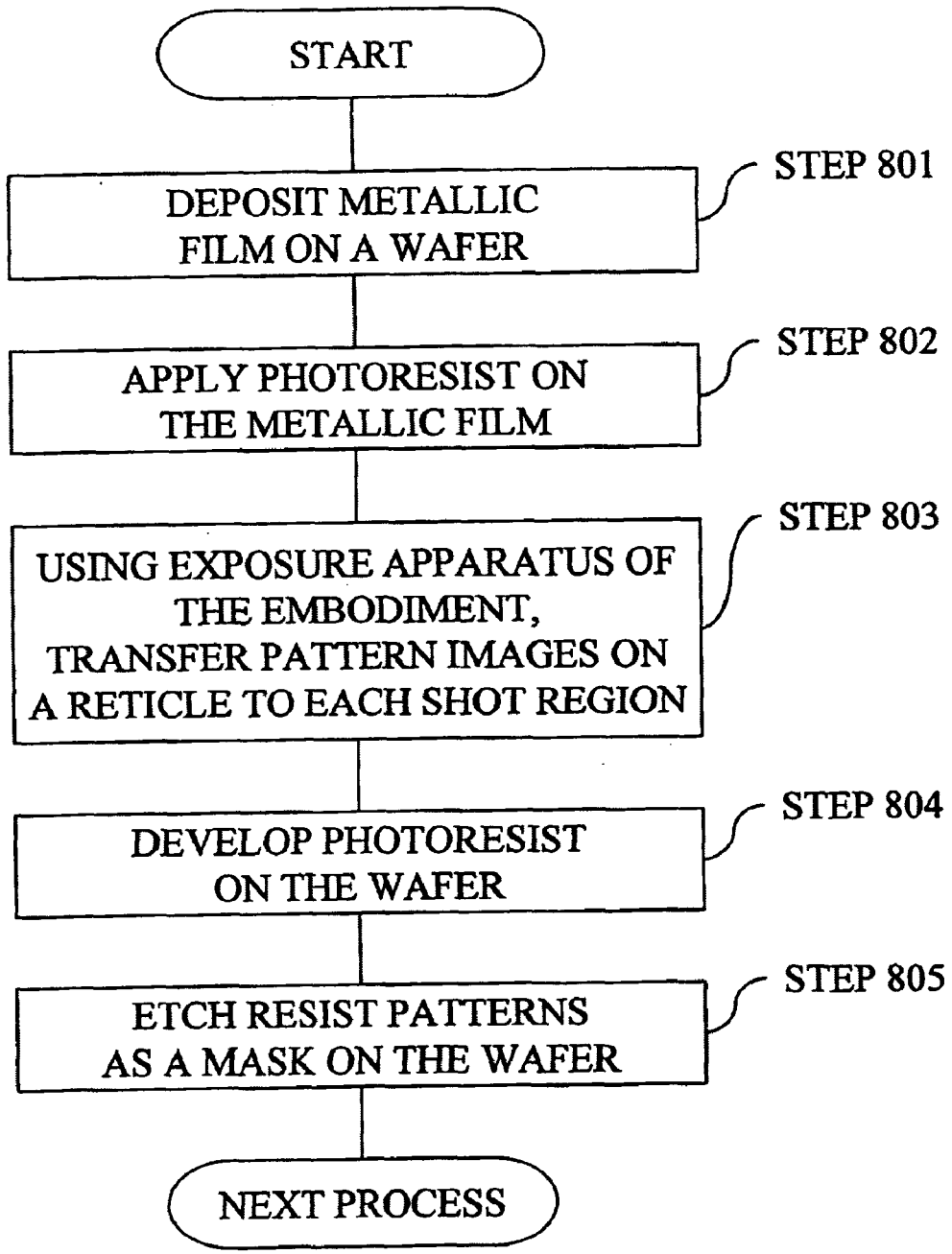
FIG. 19 is a flow chart showing an example of a method for manufacturing a micro device according to the embodiments of this invention.

First, in step 801 in FIG. 19, a metallic film is deposited on a wafer of one lot. In the next step 802, a photoresist is applied on the metallic film of the wafer of the lot. Then, in step S803, using the projection exposure apparatus of FIG. 10 equipped with any of the projection optical systems PL of the first to third embodiments, a pattern image on a reticle R is successively exposed and transferred onto each shot region on the wafer of the lot via the projection optical system PL.

After development of the photoresist on the wafer of the lot is performed in step 804, by performing etching on the wafer of the lot using the resist pattern as a mask in step 805, circuit patterns corresponding to the patterns on the reticle are formed in each shot region of each wafer. After that, by successive formation of circuit patterns in layers and the like, a device such as a semiconductor element can be produced. Using the above described method of producing the semiconductor device, a semiconductor device that has extremely minute circuit patterns can be obtained with good throughput.

Furthermore, in the projection exposure apparatus of the above-described embodiments, by forming predetermined circuit patterns on a plate (glass substrate), liquid crystal display elements may be obtained as a micro device. An example of this operation is explained below with reference to a flow chart in FIG. 20.

Figure 20:
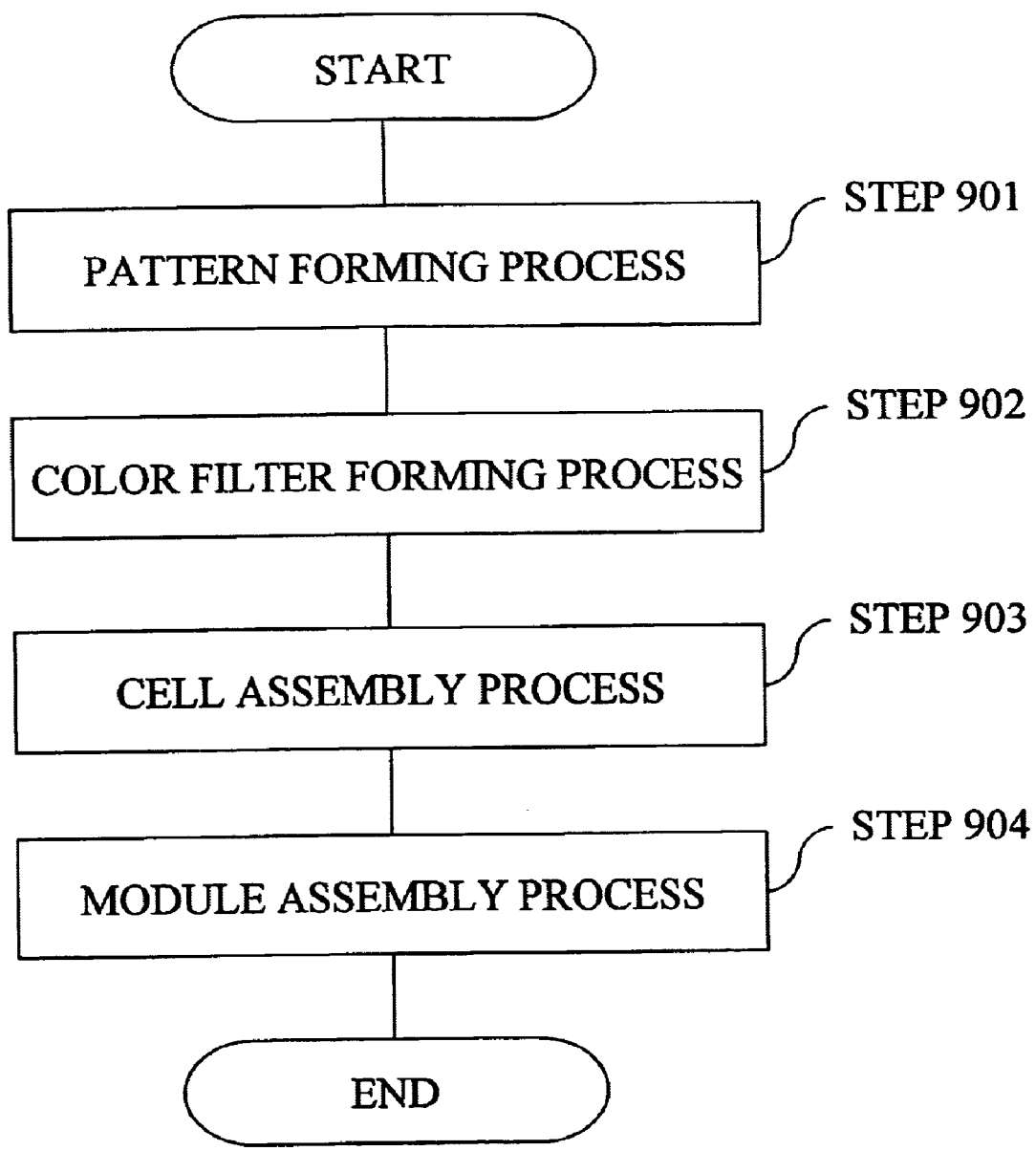
FIG. 20 is a flow chart showing another example of a method for manufacturing a micro device according to the embodiments of this invention.

In FIG. 20, a so-called optical lithography process with which a pattern of a reticle is transferred and exposed onto a photosensitive substrate (e.g., a glass substrate having a resist applied thereto) using an exposure apparatus of this embodiment, is executed in a pattern forming process 901. With this optical lithography process, predetermined patterns, including multiple numbers of electrodes, are formed on the photosensitive substrate. Then, after processing the exposed substrate with a development process, an etching process, a mask removing process and the like, predetermined patterns are formed on the substrate, and the process moves to the next color filter forming process 902.

Next, in the color filter forming process 902, a color filter in which multiple numbers of groups of three dots corresponding to R (red), G (green) and B (blue) are arranged in a matrix is formed. Then, after the color filter forming process 902, a cell assembly process 903 is executed.

In the cell assembly process 903, a liquid crystal panel (liquid crystal cell) is assembled using the substrate having the predetermined patterns obtained in the pattern forming process 901, the color filter obtained in the color filter forming process 902, and the like. In the cell assembly process 903, liquid crystal material is injected between the substrate having the predetermined patterns obtained in the pattern forming process 901 and the color filter obtained in the color filter forming process 902, for example, to produce a liquid crystal panel (liquid crystal cell).

Then, in a module assembly process 904, each part, such as electric circuits and backlights, that execute display operations of the assembled liquid crystal panel (liquid crystal cell) are installed to complete a liquid crystal display element. Using the above-described method for producing a liquid crystal display element, a liquid crystal display element having extremely minute circuit patterns can be obtained with good throughput.

In the embodiment of FIG. 10, fly's eye lenses 43 and 46 are used as an optical integrator (uniformizer and homogenizer) in the illumination optical system. However, a micro fly's eye lens, in which a plurality of lens surfaces are formed on one substrate by a method such as etching, can be used. Moreover, instead of the first fly's eye lens 43, a diffractive optical element can be used which forms circular, annular, and multipole illumination fields in the far field (Fraunhofer diffraction region) by dispersing incident light by a diffraction operation. One type of this diffraction optical element that can be used is disclosed in, for example, U.S. Pat. No. 5,850,300. When using the diffraction optical element, the optical path delay optical system 41 may be omitted.

Furthermore, as the optical integrator, an internal reflection type integrator (e.g. a rod integrator, a light pipe, and a light tunnel) can be used. When using this type of internal reflection type integrator, an irradiation surface of the internal reflection type integrator and the pattern surface of the reticle become substantially conjugate. Therefore, when applying the embodiment shown in FIG. 10, an illumination field stop (reticle blind) is positioned adjacent to the irradiation surface of the internal reflection type integrator, and the zoom lens 44 is structured such that the irradiation surface of the first fly's eye lens 43 and the incident surface of the internal reflection type integrator become substantially conjugate.

In addition, in the above first to third embodiments, a silica glass (synthesized silica) is used as a lens component in the projection optical system PL. The lens component in the projection optical system is preferably a fluoride material of at least two types selected from a group consisting of fluoride ($CaF_2$, fluorite), barium fluoride ($BaF_2$), lithium fluoride (LiF), magnesium fluoride ($MgF_2$), strontium fluoride ($SrF_2$), lithium calcium aluminum fluoride ($LiCaAlF_6$) and lithium strontium aluminum fluoride ($LiSrAlF_6$). Here, the lithium calcium aluminum fluoride and the lithium strontium aluminum fluoride are compound fluorides among the compound fluorides which are called LICAF crystals, in which a trace element, such as chrome and cerium, are not added. In addition, an anti-reflection coating can be provided on a lens surface of each lens component structuring the projection optical system PL of the above described first to third embodiments. Here, a first coating structured from three or less layers, preferably two or three layers, of films and having a small range of incident angles and high transmissivity, and a second coating structured from four or more layers and having low transmissivity and a large range of incident angles, can be applied as the anti-reflection coating. In these embodiments, by appropriately assigning the first coating and the second coating in accordance with the incident angle of the light beam to the lens surface of each lens component structuring the projection optical system PL (for example, by assigning the first coating on the lens surfaces having a narrow range of incident angle of the light beam and assigning the second coating on the lens surfaces having a wide range of the incident angle of the beam), uneven transmissivity in the image field of the projection optical system and unevenness within the angle of the light beam reaching each point in the image field of the projection optical system are reduced, even with a large numerical aperture and a large image field. In these embodiments, such assignment of the coatings is performed not only to the projection optical system but also to the illumination optical system.

Moreover, in the embodiment shown in FIG. 10, a prism composed of a double refractive material (birefringence material) for preventing speckle can be positioned on the incident side of the first fly's eye lens 43. Such prism for preventing speckle is disclosed in, for example, U.S. Pat. No. 5,253,110. When using light having a wavelength equal to or less than 180 nm as the exposure wavelength, a prism formed of a crystal of magnesium fluoride ($MgF_2$) may be used instead of the crystal prism disclosed in U.S. Pat. No. 5,253,110.

A wedge type prism formed of this magnesium fluoride crystal is positioned such that a thickness of the prism gradually changes in a direction crossing the optical axis of the illumination optical system. Then, facing the wedge type prism formed of the magnesium fluoride crystal, a wedge type prism for correcting the optical path is positioned, such that their apex angles face an opposite side from each other. This wedge type prism for correcting the optical path has the same apex angle as the prism formed of the magnesium fluoride crystal and formed of a radiation transmissive material that does not have double refractivity. Using this structure, light entering the prism and the light irradiated from the prism can have the same direction of progression.

In addition, in the embodiment shown in FIG. 10, a step-and-scan type exposure apparatus is used. However, the exposure apparatus of this embodiment can be replaced with an exposure apparatus of a stitching or slit scan type. When using the stitching or slit scan type, by synchronously scanning a reticle and wafer in a predetermined first direction mutually with respect to an illumination region having a predetermined shape on the reticle, an exposure to regions in a first row on the wafer is performed. After that, by replacing the reticle or by moving the reticle by a predetermined amount along a second direction orthogonal to the first direction of the above illumination region, the wafer is shifted in a direction conjugate with the second direction in the illumination region. Then, by synchronously scanning the reticle and the wafer in the first direction mutually with respect to the illumination region having the predetermined shape on the reticle again, exposure to the regions on a second row on the wafer is performed.

In such exposure apparatus of the stitching or slit scan type, a pattern of a reticle can be exposed on a wafer larger than an exposure field of the projection optical system. Such stitching or slit scan type exposure apparatus are disclosed in, for example, U.S. Pat. No. 5,477,304, Japanese Laid-Open Patent Application 8-330220, and Japanese Laid-Open Patent Application 10-284408. In the above-described embodiments, a batch exposure type that collectively transfers a pattern image on the reticle to predetermined shot regions on the wafer can be used.

In addition, in the embodiment shown in FIG. 10, one wafer stage that holds a wafer is provided as a workpiece (photosensitive substrate). However, as disclosed in, for example, Japanese Laid-Open Patent Application 5-175098, Japanese Laid-Open Patent Application 10-163097, Japanese Laid-Open Patent Application 10-163098, Japanese Laid-Open Patent Application 10-163099 or Japanese Laid-Open Patent Application 10-214783, a structure may be used in which two wafer stages are provided.

Furthermore, this invention may be applied not only to an exposure apparatus used for producing semiconductor elements but also to an exposure device used for producing displays including liquid crystal display elements in which device patterns are transferred onto a glass plate, an exposure apparatus used for producing thin film magnetic heads in which device patterns are transferred to a ceramic wafer, and/or an exposure apparatus used for producing image pickup elements (e.g., CCDs). This invention may be applied to an exposure apparatus that transfers circuit patterns to a glass substrate or to a silicon wafer for producing reticles and/or masks.

Suitable embodiments to which this invention is applied are described with reference to the attached drawings. However, needless to say, this invention is not limited to such embodiments. It is obvious to those skilled in the art to consider various changes and modifications in the scope of technical concepts described in the claims, and it is, of course, appreciated that such changes and modifications are included in the technical scope of this invention.

As described above, according to this invention, a projection optical system is provided that has a shorter glass path length and a fewer number of lens surfaces, and that maintains good imaging characteristics, not only at the initial state but also when the illumination conditions and/or environment change.

Furthermore, according to the embodiments of this invention, a projection exposure apparatus and a projection exposure method that can projection-expose pattern images of an extremely minute projection original onto a workpiece can be provided to form minute circuit patterns with high resolution.

What is claimed is:

1. A projection optical system that projects an image of a first plane onto a second plane via a plurality of lenses, comprising:

a first lens group arranged in an optical path between the first plane and the second plane and having a negative refractive power;

a second lens group arranged in the optical path between the first lens group and the second plane and having a positive refractive power;

a third lens group arranged in the optical path between the second lens group and the second plane;

a fourth lens group arranged in the optical path between the third lens group and the second plane; and a fifth lens group arranged in the optical path between the fourth lens group and the second plane and having a positive refractive power;

wherein, in a direction from the first plane side toward the second plane, a clear aperture of a lens surface or an outer diameter of a lens in the projection optical system increases in the first lens group, changes from increasing to decreasing in the second lens group, changes from decreasing to increasing in the third lens group, and monotonically decreases in the fifth lens group, and wherein a condition $$1.7 < Mx2/Mn3 < 4$$

is satisfied, wherein Mx2 is a clear aperture of a lens surface having the largest clear aperture, or outer diameter of a lens having the largest outer diameter, in the second lens group, and Mn3 is a clear aperture of a lens surface having the smallest clear aperture, or an outer diameter of a lens having the smallest outer diameter, in the third lens group, and wherein at least one lens of the plurality of lenses is held such that at least one of a position and an orientation is adjustable, and a numerical aperture of the second plane of the projection optical system is equal to or more than 0.8.

2. The projection optical system according to claim 1, further comprising an aperture stop positioned between the third lens group and the second plane.

3. A projection optical system that projects an image of a first plane onto a second plane via a plurality of lenses, comprising:

a first lens group arranged in an optical path between the first plane and the second plane and having a negative refractive power;

a second lens group arranged in the optical path between the first lens group and the second plane and having a positive refractive power;

a third lens group arranged in the optical path between the second lens group and the second plane and having a negative refractive power;

a fourth lens group arranged in the optical path between the third lens group and the second plane; and a fifth lens group arranged in the optical path between the fourth lens group and the second plane and having a positive refractive power;

wherein a clear aperture of a lens surface or an outer diameter of a lens of second through fourth lenses from the first plane side among the plurality of lenses in the projection optical system monotonically increases;

wherein, in a direction from the first plane side toward the second plane, a clear aperture of a lens surface or an outer diameter of a lens in the projection optical system changes from increasing to decreasing in the second lens group, changes from decreasing to increasing in the third lens group, and monotonically decreases in the fifth lens group;

wherein a condition $$0.77 < Mn4/Mx4 < 1$$

is satisfied, wherein Mx4 is a clear aperture of a lens surface having the largest clear aperture, or an outer diameter of a lens having the largest outer diameter, in the fourth lens group, and Mn4 is a clear aperture of a lens surface having the smallest clear aperture, or an outer diameter of a lens having the smallest outer diameter, in the fourth lens group;

wherein at least one lens of the plurality of lenses is held such that at least one of a position and an orientation is adjustable; and a numerical aperture on the second plane of the projection optical system is equal to or more than 0.8.

4. The projection optical system of claim 3, further including an aperture stop positioned between the third lens group and the second plane.

5. A projection optical system that projects an image of a first plane onto a second plane via a plurality of lenses, comprising:

a first lens group arranged in an optical path between the first plane and the second plane and having a negative refractive power;

a second lens group arranged in the optical path between the first lens group and the second group and having a positive refractive power;

a third lens group arranged in the optical path between the second lens group and the second plane and having a negative refractive power;

a fourth lens group arranged in the optical path between the third lens group and the second plane and having an aperture stop in the optical path; and a fifth lens group arranged in the optical path between the fourth lens group and the second plane and having a positive refractive power;

wherein, a clear aperture of a lens surface of the plurality of lenses or an outer diameter of the plurality of lenses in the projection optical system has a relative maximum in the second lens group, becomes minimum in the third lens group, and a relative maximum in the third–fifth lens groups, and has only one significant minimum between the first plane and the second plane, wherein at least one lens of the plurality of lenses is held such that at least one of a position and an orientation is adjustable, and a numerical aperture on the second plane of the projection optical system is equal to or more than 0.8.

6. The projection optical system of claim 5, wherein a gas lens arranged closest to the first plane among air lenses formed by the plurality of lenses in the projection optical system has a bi-convex shape.

7. The projection optical system of claim 6, wherein a condition $$1.7 < Mx2/Mn3 < 4$$

is satisfied, wherein Mx2 is a clear aperture of a lens surface having the largest clear aperture, or an outer diameter of a lens having the largest outer diameter, in the second lens group, and Mn3 is a clear aperture of a lens surface having the smallest clear aperture, or an outer diameter of a lens having the smallest outer diameter, in the third lens group.

8. The projection optical system of claim 7, wherein a condition $$0.77 < Mn4/Mx4 < 1$$

is satisfied, wherein Mx4 is a clear aperture of a lens surface having the largest clear aperture, or an outer diameter of a lens having the largest outer diameter, in the fourth lens group, and Mn4 is a clear aperture of a lens surface having the smallest clear aperture, or an outer diameter of a lens having the smallest outer diameter, in the fourth lens group.

9. The projection optical system of claim 8, wherein, at least one lens of each of the first to fourth lens groups is held such that at least one of a position and an orientation is adjustable.

10. The projection optical system of claim 9, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, are held such that at least one of a position and an orientation is adjustable.

11. The projection optical system of claim 10, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, has a lens surface that is rotationally asymmetrical with respect to an optical axis and is held such that at least one of a position and an orientation is adjustable.

12. The projection optical system of claim 11, wherein at least one lens of the plurality of lenses in the projection optical system positioned closer to the first plane side than the aperture stop, and at least one lens of the plurality of lenses in the projection optical system positioned closer to the second plane than the aperture stop are held such that at least one of a position and an orientation is adjustable.

13. The projection optical system of claim 12, wherein at least one lens of the plurality of lenses in the projection optical system positioned closer to the first plane side than the aperture stop, and at least one lens of the plurality of lenses in the projection optical system positioned closer to the second plane than the aperture stop, have a lens surface that is rotationally asymmetrical with respect to an optical axis, and are held such that at least one of a position and an orientation is adjustable.

14. The projection optical system of claim 13, wherein the first lens group has at least one negative lens,
the second lens group has at least one negative lens and at least three positive lenses,
the third lens group has at least two negative lenses, and
the fifth lens group has at least four positive lenses.

15. The projection optical system of claim 14, wherein at least one lens of the plurality of lenses in the projection optical system has an aspherical shaped lens surface.

16. The projection optical system of claim 15, wherein the lens having the aspherical shaped lens surface is held such that at least one of a position and orientation is adjustable.

17. The projection optical system of claim 16, wherein the plurality of lenses in the projection optical system have at least a first aspherical lens having an aspherical lens surface, and a second aspherical lens having an aspherical lens surface, and
a condition $$0.8 < D1/D2 < 1.2$$

is satisfied, wherein D1 is a clear aperture of a lens surface or an outer diameter of the first aspherical lens, and D2 is a clear aperture of a lens surface or an outer diameter of the second aspherical lens.

18. A projection exposure apparatus that projects and exposes a pattern image provided on an original onto a workpiece, comprising:
a light source that supplies exposure light;
an illumination optical system that directs the exposure light from the light source to the pattern on the original; and
the projection optical system of claim 1,
wherein the original is positioned on the first plane, and the workpiece is positioned on the second plane.

19. A projection exposure apparatus that projects and exposes a pattern image provided on an original onto a workpiece, comprising:
a light source that provides exposure light;
an illumination optical system that directs the exposure light from the light source to the pattern on the original; and
the projection optical system of claim 3,
wherein the original is positioned on the first plane, and the workpiece is positioned on the second plane.

20. A projection exposure apparatus that projects and exposes a pattern image provided on an original onto a workpiece, comprising:
a light source that supplies exposure light;
an illumination optical system that directs the exposure light from the light source to the pattern on the original, and
the projection optical system of claim 5,
wherein the original is positioned on the first plane, and the workpiece is positioned on the second plane.

21. A projection exposure method for projecting and exposing a pattern image provided on an original onto a workpiece, comprising the steps of:
supplying exposure light;
directing the exposure light to the pattern on the original; and
projecting the pattern image on the original positioned on the first plane onto the workpiece positioned on the second plane using the projection optical system of claim 1.

22. A projection exposure method for projecting and exposing a pattern image provided on an original to a workpiece, comprising the steps of:

supplying exposure light;

directing the exposure light to the pattern on the original; and projecting the pattern image on the original positioned on the first plane onto the workpiece positioned on the second plane using the projection optical system of claim 3.

23. A projection exposure method for projecting and exposing a pattern image provided on an original to a workpiece, comprising the steps of:

supplying exposure light;

directing the exposure light to the pattern on the original; and projecting the pattern on the original positioned on the first plane onto the workpiece positioned on the second plane using the projection optical system of claim 5.

24. A projection optical system that projects an image of a first plane onto a second plane via a plurality of lenses, comprising:

a first lens group arranged in an optical path between the first plane and the second plane and having a negative refractive power;

a second lens group arranged in the optical path between the first lens group and the second plane and having a positive refractive power;

a third lens group arranged in the optical path between the second lens group and the second plane;

a fourth lens group arranged in the optical path between the third lens group and the second plane; and a fifth lens group arranged in the optical path between the fourth lens group and the second plane and having a positive refractive power;

wherein at least one lens of the plurality of lenses is held such that at least one of a position and an orientation is adjustable; and a numerical aperture on the second plane of the projection optical system is equal to or more than 0.8.

25. A projection exposure system for generating, in an image plane, an image of a mask arranged in an object plane, with a light source emitting projection light and projection optics arranged between the mask and the image plane, wherein the following are arranged in a beam path of the projection optics, starting from the mask:

a) a first group of optical components having an overall positive refractive power;

b) a second group of optical components having an overall negative refractive power;

c) a third group of optical components having an overall positive refractive power;

d) a fourth group of optical components having an overall negative refractive power; and e) a fifth group of optical components having an overall positive refractive power; wherein:

f) at least a first optical subgroup, a second optical subgroup and a third optical subgroup each have at least one optical component that can be displaced along an optical axis of the projection optics;

g) the first optical subgroup comprises one of the mask and at least one optical component from the frist group of optical components;

h) the second optical subgroup comprises at least one optical component from one of the second and third groups of optical components; and i) the third optical subgroup comprises at least one optical component from one of the third and fourth groups of optical components.

26. The projection exposure system according to claim 25, wherein the second optical subgroup is arranged next to the first group of optical components.

27. The projection exposure system according to claim 25, further comprising an instrument for adjusting a wavelength.

28. The projection exposure system according to claim 27, wherein the adjustment instrument includes means for altering an emission wavelength of the light source.

29. The projection exposure system according to claim 25, wherein the optical components are refractive components.

30. A projection exposure method for projecting and exposing a pattern image provided on a mask onto a workpiece, comprising the steps of:

supplying exposure light;

directing the exposure light to the pattern on the mask; and projecting the pattern onto the workpiece using the projection exposure system of claim 25.

31. The projection optical system of claim 1, wherein at least one lens of each of the first to fourth lens groups is held such that at least one of a position and an orientation is adjustable.

32. The projection optical system of claim 1, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, are held such that at least one of a positioned and an orientation is adjustable.

33. The projection optical system of claim 1, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, has a lens surface that is rotationally asymmetrical with respect to an optical axis and is held such that at least one of a position and an orientation is adjustable.

34. The projection optical system of claim 1, wherein:

the first lens group has at least one negative lens;

the second lens group has at least one negative lens and at least three positive lenses;

the third lens group has at least two negative lenses; and the fifth lens group has at least four positive lenses.

35. The projection optical system of claim 1, wherein at least one lens of the plurality of lenses in the projection optical system has an aspherical shaped lens surface.

36. The new projection optical system of claim 35, wherein the lens having the aspherical shaped lens surface is held such that at least one of a position and an orientation is adjustable.

37. The projection system of claim 1, wherein the plurality of lenses in the projection optical system have at least a first aspherical lens having an aspherical lens surface, and a second aspherical lens having an aspherical lens surface, and a condition $$0.8 < D1/D2 < 1.2$$

is satisfied, wherein D1 is an clear aperture of a lens surface or an outer diameter of the first aspherical lens, and D2 is an clear aperture of a lens surface or an outer diameter of the second aspherical lens.

38. The projection optical system of claim 1, wherein the adjustable lens is moved when an environment with respect to the projection optical system changes.

39. The projection optical system of claim 1, wherein the adjustable lens is moved when an illumination condition changes.

40. The projection optical system of claim 1, wherein at least two lenses of the plurality of lenses are held such that at least one of a position and an orientation is adjustable, and the two adjustable lenses are moved individually.

41. The projection optical system of claim 4, wherein at least one lens of the plurality of lenses in the projection optical system positioned closer to the first plane than the aperture stop, and at least one lens of the plurality of lenses in the projection optical system positioned closer to the second plane than the aperture stop, are held such that at least one of a position and an orientation is adjustable.

42. The projection optical system of claim 4, wherein at least one lens of the plurality of lenses in the projection optical system positioned closer to the first plane than the aperture stop, and at least one lens of the plurality of lenses in the projection optical system positioned closer to the second plane than the aperture stop, have a lens surface that is rotationally asymmetrical with respect to an optical axis, and are held such that at least one of a position and an orientation is adjustable.

43. The projection optical system of claim 3, wherein at least one lens of each of the first to fourth lens groups is held such that at least one of a position and an orientation is adjustable.

44. The projection optical system of claim 3, wherein at least one lens positioned between the first plane and the lens surface having the smallest clear aperture, or the lens having the smallest outer diameter,in the third lens group, and at least one lens positioned between the second plane and the lens surface having the smallest clear aperture, or the lens having the smallest outer diameter, in the third lens group, are held such that at least one of a position and an orientation is adjustable.

45. The projection optical system of claim 3, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, has a lens surface that is rotationally asymmetrical with respect to an optical axis, and is held such that at least one of a position and orietation is adjustable.

46. The projection optical system of claim 3, wherein:
the first lens group has at least one negative lens;
the second lens group has at least one negative lens and at least three positive lenses;
the third lens group has at least two negative lenses; and
the fifth lens group has at least four positive lenses.

47. The projection optical system of claim 3, wherein at least one lens of the plurality of lenses in the projection optical system has an aspherical shaped lens surface.

48. The projection optical system of claim 47, wherein the lens having the aspherical shaped lens surface is held such that at least one of a position and an orientation is adjustable.

49. The projection optical system of claim 3, wherein the plurality of lenses in the projection optical system have at least a first aspherical lens having an aspherical lens surface, and a second aspherical lens having an aspherical lens surface, and a condition $$0.8 < D1/D2 < 1.2$$

is satisfied, wherein D1 is a clear aperture of a lens surface or an outer diameter of the first aspherical lens, and D2 is a clear aperture of a lens surface or an outer diameter of the second aspherical lens.

50. The projection optical system of claim 3, wherein the adjustable lens is moved when an environment with respect to the projection optical system charges.

51. The projection optical system of claim 3, wherein the adjustable lens is moved when an illumination condition changes.

52. The projection optical system of claim 3, wherein at least two lenses of the plurality of lenses are held such that at least one of a position and an orientation is adjustable, and the two adjustable lenses are moved individually.

53. A projection exposure apparatus that projects and exposes a pattern image provided on an original onto a workpiece, comprising:
a light source that supplies exposure light;
an illumination optical system that directs the exposure light from the light source to the pattern on the original; and
the projection optical system of claim 17,
wherein the original is positioned on the first plane, and the workpiece is positioned on the second plane.

54. A projection exposure method for projecting and exposing a pattern image provided on an original onto a workpiece, comprising the steps of:
supplying exposure light;
directing the exposure light to the original; and
projecting the pattern image on the original positioned on the first plane onto the workpiece positioned on the second plane using the projection optical system of claim 17.

55. The projection optical system of claim 5, wherein a condition $$1.7 < Mx2/Mn3 < 4$$

is satisfied, wherein Mx2 is an clear aperture of a lens surface having the largest clear aperture, or outer diameter of a lens having the largest outer diameter, in the second lens group, and Mn3 is an clear aperture of a lens surface having the smallest clear aperture, or an outer diameter of a lens having the smallest outer diameter, in the third lens group.

56. The projection optical system of claim 5, wherein a condition $$0.77 < Mn4/Mx4 < 1$$

is satisfied, wherein Mx4 is an clear aperture of a lens surface having the largest clear aperture, or an outer diameter of a lens having the largest outer diameter, in the fourth lens group, and Mn4 is a clear aperture of a lens surface having the smallest clear aperture, or an outer diameter of a lens having the smallest outer diameter, in the fourth lens group.

57. The projection optical system of claim 5 wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, are held such that at least one of a position and an orientation is adjustable.

58. The projection optical system of claim 5, wherein at least one lens positioned between the first plane and the lens surface having the smallest clear aperture, or the lens having the smallest outer diameter, in the third lens group, and at least one lens positioned between the second plane and the lens surface having the smallest clear aperture, or the lens having the smallest outer diameter, in the third lens group, has a lens surface that is rotationally asymmetrical with respect to an optical axis, and is held such that at least one of a position and an orientation is adjustable.

59. The projection optical system of claim 5, wherein at least one lens of the plurality of lenses in the projection optical system positioned closer to the first plane than the aperture stop, and at least one lens of the plurality of lenses in the projection optical system positioned closer to the second plane than the aperture stop, are held such that at least one of a position and an orientation is adjustable.

60. The projection optical system of claim 5, wherein at least one lens of the plurality of lenses in the projection optical system positioned closer to the first plane than the aperture stop, and at least one lens of the plurality of lenses in the projection optical system positioned closer to the second plane than the aperture stop, have a lens surface that is rotationally asymmetrical with respect to an optical axis, and are held such that at least one of a position and an orientation is adjustable.

61. The projection optical system of claim 5, wherein:
the first lens group has at least one negative lens;
the second lens group has at least one negative lens and at least three positive lenses;
the third lens group has at least two negative lenses; and
the fifth lens group has at least four positive lenses.

62. The projection optical system of claim 5, wherein at least one lens of the plurality of lenses in the projection optical system has an aspherical shaped lens surface.

63. The projection optical system of claim 62, wherein the lens having the aspherical shaped lens surface is held such that at least one of a position and an orientation is adjustable.

64. The projection optical system of claim 5, wherein the plurality of lenses in the projection optical system have at least a first aspherical lens having an aspherical lens surface, and
a condition $$0.8 < D1/D2 < 1.2$$

is satisfied, wherein D1 is a clear aperture of a lens surface or an outer diameter of the first aspherical lens, and D2 is a clear aperture of a lens surface or an outer diameter of the second aspherical lens.

65. The projection optical system of claim 5, wherein the adjustable lens is moved when an environment with respect to the projection optical system changes.

66. The projection optical system of claim 5, wherein the adjustable lens is moved when an illumination condition changes.

67. The projection optical system of claim 5, wherein at least two lenses of the plurality of lenses are held such that at least one of a position and an orientation is adjustable, and
the two adjustable lenses are moved individually.

68. The projection optical system of claim 24, wherein the adjustable lens is moved when an environment with respect to the projection optical system changes.

69. The projection optical system of claim 24, wherein the adjustable lens is moved when an illumination condition changes.

70. The projection optical system of claim 24, wherein at least two lenses of the plurality of lenses are held such that at least one of the position and an orientation is adjustable, and
the two adjustable lenses are moved individually.

71. A projection exposure apparatus that projects and exposes a pattern image provided on an original onto a workpiece, comprising:
a light source that supplies exposure light;
an illumination optical system that directs the exposure light from the light source to the pattern on the original; and
the projection optical system of claim 24,
wherein the original is positioned on the first plane, and the workpiece is positioned on the second plane.

72. A projection exposure method for projecting and exposing a pattern image provided on an original onto a workpiece, comprising the steps of:
supplying exposure light;
directing the exposure light to the pattern on the original; and
projecting the pattern image on the original positioned on the first plane onto the workpiece positioned on the second plane using the projection optical system of claim 24.

73. A projection exposure method for projecting and exposing a pattern image provided on an original onto a workpiece, comprising the steps of:
supplying exposure light;
directing the exposure light to the pattern on the original; and
projecting the pattern image on the original positioned on the first plane onto the workpiece positioned on the second plane using the projection optical system of claim 28.

74. The projection exposure system according to claim 25, wherein each orientation of the optical components in the first optical subgroup, the second optical subgroup, and the third optical subgroup, is adjustable.

75. The projection exposure system of claim 25, wherein at least one optical component of the optical components in the first to third optical subgroups is moved when an environment with respect to the projection optical system changes.

76. The projection exposure system of claim 25, wherein at least one optical component of the optical components in the first to third optical subgroups is moved when an illumination condition changes.

77. The projection exposure system of claim 25, wherein at least two optical components of the optical components in the first to third optical subgroups are moved individually.

* * * * *